US011362151B2

(12) United States Patent
Bok et al.

(10) Patent No.: US 11,362,151 B2
(45) Date of Patent: Jun. 14, 2022

(54) DISPLAY DEVICE WITH LOAD MATCHING DEVICE OVERLAPPING NON-DISPLAY AREA

(71) Applicant: Samsung Display Co., Ltd., Yongin-Si (KR)

(72) Inventors: Seung-Lyong Bok, Hwaseongsi (KR); Sunho Kim, Seongnam-si (KR)

(73) Assignee: Samsung Display Co., Ltd.

( * ) Notice: Subject to any disclaimer, the term of this patent is extended or adjusted under 35 U.S.C. 154(b) by 188 days.

(21) Appl. No.: 16/786,901

(22) Filed: Feb. 10, 2020

(65) Prior Publication Data

US 2020/0258952 A1 Aug. 13, 2020

(30) Foreign Application Priority Data

Feb. 11, 2019 (KR) .......................... 10-2019-0015323

(51) Int. Cl.
*H01L 27/32* (2006.01)
*H01L 51/52* (2006.01)
*H01L 27/12* (2006.01)

(52) U.S. Cl.
CPC ...... *H01L 27/3223* (2013.01); *H01L 27/3262* (2013.01); *H01L 27/3272* (2013.01); *H01L 27/3276* (2013.01); *H01L 51/5246* (2013.01); *H01L 27/124* (2013.01)

(58) Field of Classification Search
CPC ............. H01L 27/3223; H01L 27/3262; H01L 27/3272; H01L 27/3276; H01L 27/124; H01L 51/5246
See application file for complete search history.

(56) References Cited

U.S. PATENT DOCUMENTS

| 8,963,818 | B2 * | 2/2015 | Kim ..................... G09G 3/3648 345/87 |
| 2017/0249896 | A1 * | 8/2017 | Kim ..................... G09G 3/3266 |
| 2017/0301280 | A1 * | 10/2017 | Ka ........................ G09G 3/3406 |
| 2018/0090061 | A1 * | 3/2018 | Kim ..................... G09G 3/3208 |
| 2018/0204889 | A1 | 7/2018 | Yu et al. |
| 2018/0240856 | A1 * | 8/2018 | Kim ..................... H01L 27/3258 |
| 2018/0342194 | A1 | 11/2018 | Li et al. |
| 2018/0342572 | A1 * | 11/2018 | Park ..................... H01L 27/124 |
| 2018/0366066 | A1 * | 12/2018 | Kim ..................... G09G 3/3677 |
| 2019/0019789 | A1 * | 1/2019 | Kim ..................... H01L 27/0296 |
| 2019/0096978 | A1 * | 3/2019 | Jung .................... G09G 3/3225 |
| 2019/0157630 | A1 * | 5/2019 | Kwon ................. H01L 27/1248 |

FOREIGN PATENT DOCUMENTS

| KR | 10-2017-0059864 A | 5/2017 |
| KR | 10-2017-0137259 A | 12/2017 |
| KR | 10-2018-0033373 A | 4/2018 |

* cited by examiner

*Primary Examiner* — Lex H Malsawma
(74) *Attorney, Agent, or Firm* — Innovation Counsel LLP

(57) ABSTRACT

A display apparatus may include a first plurality of pixels, a substrate, a first signal line, and a load matching device. The substrate may include a first opening, a first non-display area, and a main display area. The first non-displaying area may at least partially surround the first opening. The main display area may support the first plurality of pixels. The first signal line may be electrically connected to the first plurality of pixels, may overlap the main display area, and may overlap the first non-display area. The load matching device may overlap the first non-display area and may provide a first electrical load to the first signal line.

20 Claims, 25 Drawing Sheets

DISPLAY DEVICE WITH LOAD MATCHING DEVICE OVERLAPPING NON-DISPLAY AREA

This application claims priority to Korean Patent Application No. 10-2019-0015323, filed on Feb. 11, 2019; the content of the Korean Patent Application is incorporated by reference.

BACKGROUND

1. Field

The technical field may relate to a display apparatus.

2. Description of the Related Art

Modern display apparatuses, such as plasma display apparatuses, liquid crystal display apparatuses, and organic light emitting display apparatuses, may be included in various electronic devices, such as mobile phones, for displaying images. In an electronic device, a display apparatus may be functionally and/or structurally combined with one or more other components, such as a camera. The component(s) may affect the performance of the display apparatus.

SUMMARY

One or more embodiments may be related to a display apparatus capable of displaying images with satisfactory quality in a maximized display area.

According to an embodiment, a display apparatus includes a substrate including a first opening area through which light passes, a first opening peripheral area which is non-displaying area and surrounds the first opening area, and a main display area in which a plurality of pixels are disposed configured to display an image, a first signal line electrically connected to the pixel, and a passing the first opening peripheral area, and a load matching part disposed in the first opening peripheral area configured to provide electrical load to the first signal line.

In an embodiment, the main display area may have a quadrangular shape disposed on a plane formed along a first direction and a second direction perpendicular to the first direction. The substrate may include first to fourth edge display areas which are in contact with each side of the main display area and bent at a predetermined angle with respect to the main display area.

In an embodiment, a signal line may be a scan line for proving a scan signal to the pixel. The load matching part may include a load matching electrode disposed to overlap the signal line, and provides the load to the signal line by parasitic capacitance formed by the signal line and the load matching electrode.

In an embodiment, the display apparatus may further include a lower conductive layer disposed on the substrate and including the load matching electrode and a lower shielding electrode, a lower insulating layer disposed on the lower conductive layer, an active pattern of a thin film transistor, disposed on the lower insulating layer, and overlapping the lower shielding electrode, a gate insulating layer disposed on the active pattern, and a gate conductive layer including a gate electrode of the thin film transistor and the scan line, disposed on the gate insulating layer.

In an embodiment, the display apparatus may further include an active pattern of a thin film transistor disposed on the substrate, a gate insulating layer disposed on the active pattern, a gate conductive layer including a gate electrode of the thin film transistor and the scan line, disposed on the gate insulating layer, an interlayer insulating layer disposed on the gate conductive layer, and a data conductive layer disposed on the interlayer insulating layer, and including source and drain electrodes electrically connected to the active pattern and the load matching electrode.

In an embodiment, the load matching part may be a dummy pixel electrically connected to the signal line.

In an embodiment, the load matching part may be a portion in which a portion of the signal line formed in a zigzag arrangement to increase wiring resistance.

In an embodiment, the signal line may have a first thickness and a second thickness thinner than the first thickness depending on a location. The load matching part may be a portion having the second thickness of the signal line.

In an embodiment, the display apparatus may further include a second signal line which does not pass through the first opening peripheral area. The second signal line and the load matching part may be spaced apart from each other.

In an embodiment, the display apparatus may further include a second signal line which does not pass through the first opening peripheral area, and a first gate circuit including a first output buffer is electrically connected to the first signal line, and a second gate circuit including a second output buffer is electrically connected to the second signal line.

In an embodiment, a size of the second output buffer may be larger than a size of the first output buffer.

In an embodiment, the second output buffer may include a double gate transistor.

The first output buffer may include a single gate transistor.

In an embodiment, a first hole may be formed through the substrate in the first opening area.

In an embodiment, the substrate may further include a second opening area spaced apart from the first opening area, and a second opening peripheral area which is non-displaying area and surrounds the first opening area. The first signal line may pass through the second opening peripheral area. The display apparatus may further include a second load matching part disposed in the second opening peripheral area to provide a load to the first signal line.

In an embodiment, the substrate may further include a second opening area spaced apart from the first opening area. The first opening peripheral area may surround the first and second opening areas.

In an embodiment, the main display area may have a length in the first direction longer than a length in the second direction. The first opening area may be adjacent to a long side extending in the second direction of the main display area.

In an embodiment, the first opening area may be formed in the first edge display area. The substrates in the first opening area and the first opening peripheral area may be flat.

In an embodiment, the first opening area may be formed at an edge of the main display area, and the first opening peripheral area may surround only a portion of the first opening area.

In an embodiment, a display apparatus may further include a lower conductive later disposed under the substrate, and including a lower light shielding pattern and a lower shielding electrode, a lower insulating layer disposed on the lower conductive later, an active pattern of a thin film transistor disposed on the lower insulating layer and overlapping the lower shielding electrode, a light emitting structure disposed on the substrate and electrically connected to the thin film transistor, a cover window disposed on the substrate, a light shielding member disposed between the display substrate and the cover window and overlapping the first opening peripheral area, and an optical module overlapping the first opening area. The lower light shielding pattern may overlap the first opening peripheral.

According to an embodiment, a display apparatus includes a substrate including a first opening area which transmits light, a first opening peripheral area which is a non-displaying area surrounding the first opening area, and a main display area surrounding the first opening peripheral in which a plurality of pixels are disposed, and a first signal line electrically connected to the pixel, and passing through the first opening peripheral area. The main display area may have a quadrangular shape disposed on a plane formed along a first direction and a second direction perpendicular to the first direction. The substrate may include first to fourth edge display areas which are in contact with each side of the main display area and bent at a predetermined angle with respect to the main display area.

According to an embodiments, a display apparatus includes a substrate including a first opening area that transmits light, a first opening peripheral area that is a non-display area surrounding the first opening area, and a main display area that surrounds the first opening peripheral area, in which a plurality of pixels are disposed and an image is displayed, a first signal line electrically connected to the pixel and passing through the first opening peripheral area; and a load matching part disposed in the first opening peripheral area and providing a load to the first signal line. The display apparatus includes the opening area for positioning an optical module and an edge display area disposed at an edge portion of the main display area, and the load matching part is disposed in the opening peripheral area that surrounds the opening area, so that the display quality can be improved while expanding the display area.

An embodiment may be related to a display apparatus. The display apparatus may include a first plurality of pixels, a substrate, a first signal line, and a load matching device. The substrate may include a first opening, a first non-display area, and a main display area. The first non-displaying area may at least partially surround the first opening. The main display area may support the first plurality of pixels. The first signal line may be electrically connected to the first plurality of pixels, may overlap the main display area, and may overlap the first non-display area. The load matching device may overlap the first non-display area and may provide a first electrical load to the first signal line.

The substrate may include four edge display areas respectively directly connected to four sides of the main display area and each bent at a predetermined angle with respect to the main display area.

The first signal line may be a scan line for proving a scan signal to the first plurality of pixels. The load matching device may include a load matching electrode. The load matching electrode may overlap the signal line and may provide the first electrical load to the signal line by parasitic capacitance formed by the first signal line and the load matching electrode.

The display apparatus may include the following elements: a shielding electrode; a first insulating layer disposed directly on each of the load matching electrode and the shielding electrode; an active member of a thin film transistor disposed on the first insulating layer and overlapping the shielding electrode; a gate insulating layer disposed on the active member of the thin film transistor; and a gate electrode of the thin film transistor disposed on the gate insulating layer.

The display apparatus may include the following elements: an active member of a thin film transistor disposed on the substrate; a gate insulating layer disposed on the active member of the thin film transistor; a gate electrode of the thin film transistor disposed on the gate insulating layer; an interlayer insulating layer disposed on each of the gate electrode and the scan line; and a source electrode and a drain electrode each disposed directly on the interlayer insulating layer and each electrically connected to the active member of the thin film transistor. The load matching electrode may be disposed directly on the interlayer insulating layer. A material of the load matching electrode may be identical to a material of each of the source electrode and the drain electrode.

The load matching device may be a dummy pixel electrically connected to the first signal line.

The load matching device may include a zigzag structure electrically connected to the first signal line.

The first signal line may have a first width perpendicular to a lengthwise direction of the first signal line. The load matching device may be electrically connected to the first signal line and may have a second width perpendicular to the lengthwise direction of the first signal line. The first width may be unequal to the second width.

The display apparatus may include a second signal line spaced from each of the first non-display area and the load matching device in a plan view of the display apparatus.

The display apparatus may include the following elements: a second signal line spaced from the first non-display area in a plan view of the display apparatus; a first gate circuit including a first output buffer that is electrically connected to the first signal line; and a second gate circuit including a second output buffer that is electrically connected to the second signal line The second output buffer may be larger than the first output buffer.

The second output buffer may include a double gate transistor. The first output buffer may include a single gate transistor.

The first opening may include a first through hole that extends through the substrate.

The substrate may include a second opening spaced apart from the first opening and may include a second non-display area surrounding the second opening. The first signal line may overlap the second non-display area. The display apparatus further may include a second load matching device overlapping the second non-display area and configured to provide a second electrical load to the first signal line.

The substrate further may include a second opening spaced apart from the first opening. The first non-display area may surround each of the first opening and the second opening.

The first opening may be positioned closer to a first side of the main display area than to a second side of the main display area. The first side of the main display area may be opposite the second side of the main display area and may be shorter than a third side of the main display area.

The display apparatus may include a second plurality of pixels. The substrate may include a first edge display area. The first edge display area may support the second plurality of pixels and may be bent relative to the main display area. The first opening may be formed in the first edge display area.

The first opening may be formed at an edge of the main display area. The first non-display area may partially surround the first opening.

The display apparatus may include the following elements: a first light shielding member overlapping the first non-display area; a shielding electrode; an insulating layer disposed on each of the first light shielding member and the shielding electrode; an active member of a thin film transistor disposed on the lower insulating layer and overlapping the shielding electrode; a light emitting structure disposed on the substrate and electrically connected to the thin film transistor; a cover window disposed on the substrate; a second light shielding member disposed between the substrate and the cover window and overlapping the first non-display area; and an optical module overlapping a position of the first opening.

An embodiment may be related to a display apparatus. The display apparatus may include a first plurality of pixels, a substrate, and a first signal line. The substrate may include a first opening, a first non-display area, a main display area, and four edge display areas. The first non-displaying area may at least partially surround the first opening. The main display area may surround the first non-display and may support the first plurality of pixels. The four edge display areas may be respectively directly connected to four sides of the main display area and may be each bent at a predetermined angle relative to the main display area. The first signal line may be electrically connected to the first plurality of pixels and may overlap the first non-display area.

DETAILED DESCRIPTION

Example embodiments are described with reference to the accompanying drawings.

The term "pattern" may mean "member." The term "part" may mean "component" or "device." The term "connect" may mean "electrically connect." The term "insulate" may mean "electrically insulate" or "electrically isolate." The term "opening area" may mean "opening." A list of items may mean at least one of the listed items.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

Figure 1:
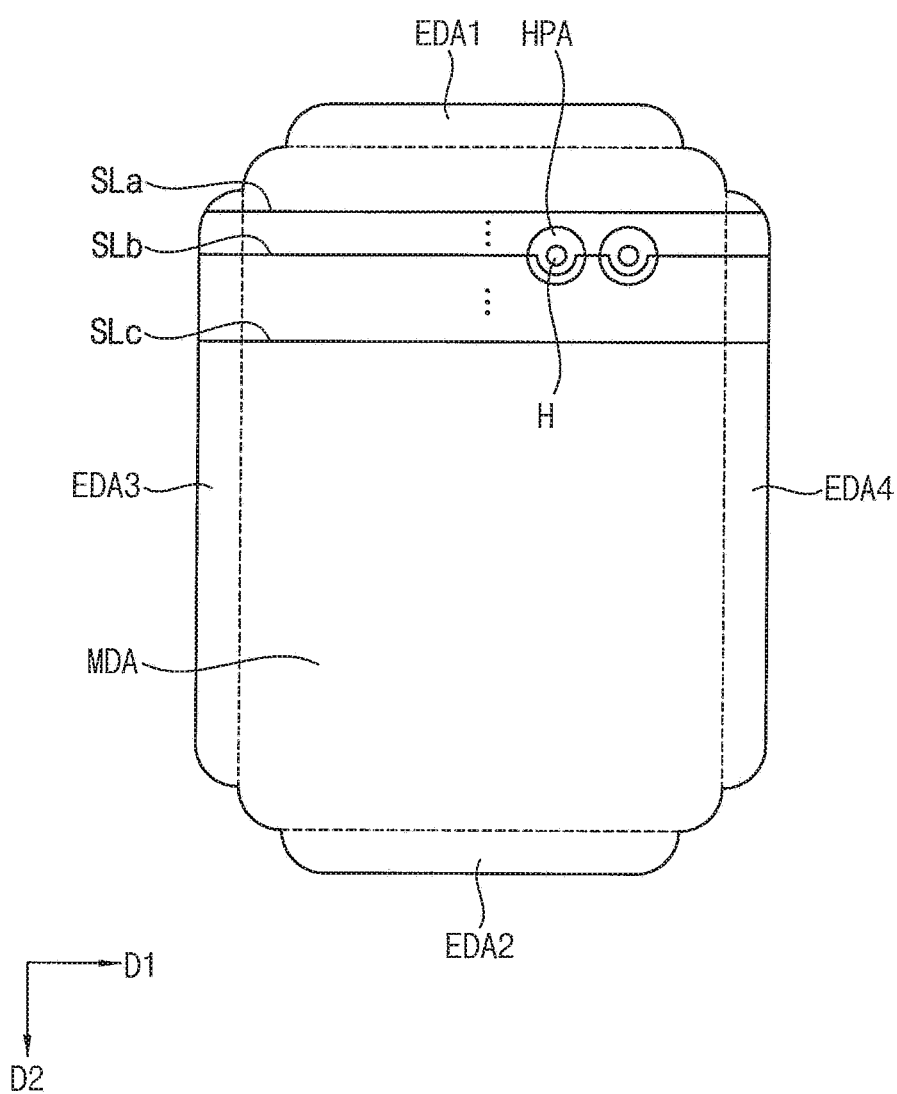
FIG. 1 is a plan view illustrating a display apparatus according to an embodiment.
Figure 2:
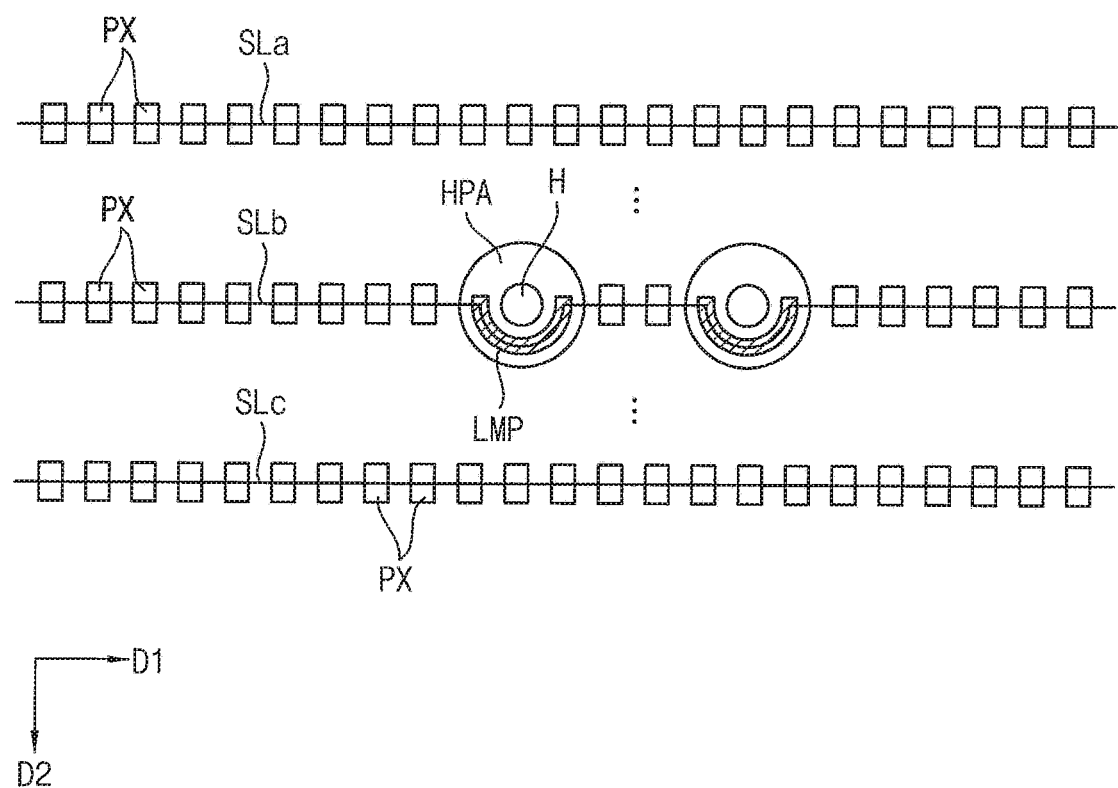
FIG. 2 is a plan view illustrating an opening of the display apparatus of FIG. 1 and its vicinity according to an embodiment.

FIG. 1 is a plan view illustrating a display apparatus according to an embodiment. FIG. 2 is a plan view illustrating an opening area H of the display apparatus of FIG. 1 and its vicinity according to an embodiment.

Referring to FIGS. 1 and 2, the display apparatus may include a substrate including a main display area MDA, a first edge display area EDA1, a second edge display area EDA2, a third edge display area EDA3 and a fourth edge display area EDA4. Although not indicated in the figures, a peripheral non-display area in which no image is displayed may be positioned along one or more edges of the display apparatus.

A plurality of pixels PX for displaying an image may be disposed in the main display area MDA and the edge display areas EDA1 to EDA4. The main display area MDA may have a substantially rectangular shape on a plane defined by a first direction D1 and a second direction D2 perpendicular to the first direction D1. A lengthwise direction of the rectangular shape may be the second direction D2. A corner of the main display area MDA may have a rounded structure.

The first edge display area EDA1 may be bent at a boundary between the main display area MDA and the first edge display area EDA1 so that an image display face of the first edge display area EDA1 is inclined at a predetermined angle with respect to an image display face of the main display area MDA. Each of the edge display areas EDA2 through EDA4 may be inclined at a predetermined angle with respect to the main display area MDA similar to the first edge display area EDA1.

The main display area MDA may include an opening area H for installing an optical module and may include an opening peripheral area HPA which is a non-display area surrounding the opening area H. The opening area H of the substrate may transmit light. For example, a circular through hole may be formed in the opening area H and may extend through the substrate, and/or a transparent window (e.g., a colorless transparent window) may be formed in the opening area H.

An optical module (not shown) may overlap, may be exposed by, or may be disposed in the opening area H. For example, the optical module may include at least one of a camera module for capturing (or recognizing) an image of an object, a face recognition sensor module for sensing a face of a user, a pupil recognition sensor module for sensing a pupil of a user, one or more acceleration and geomagnetic sensor modules for determining movement of the display apparatus, one or more proximity and/or infrared sensor modules for detecting proximity to the display apparatus, and a light intensity sensor module for measuring the degree of brightness (when left in a pocket or a bag), etc.

The display apparatus may include a signal line electrically connected to some of the pixels PX and may include a load matching part LMP disposed in the opening peripheral area HPA.

A plurality of scan lines may be electrically connected to the pixels PX to transmit scan signals to the pixel PX. For example, the scan lines may include a first scan line SLa, a second scan line SLb, and a third scan line SLc. The scan lines SLa to SLc may substantially extend in the first direction D1 and may be arranged in the second direction D2.

The first scan line SLa and the third scan line SLc do not pass through the opening peripheral area HPA. The second scan line SLb may pass through the opening peripheral area HPA. A portion of the second scan line SLb may be disposed in the opening peripheral area HPA.

Most of the pixels PX are disposed at uniform intervals. The second scan line SLb passes through the opening peripheral area HPA, which is a non-display area, so that the number of pixels PX connected to the second scan line SLb is smaller than the number of pixels PX connected to each of the scan lines SLa and SLc. Accordingly, less gate loading occurs in the second scan line SLb than in each of the scan lines SLa and SLc, so that there is a need to provide additional load to the second scan line SLb.

The load matching part LMP may be/include at least one of a load matching electrode forming a loading capacitor with the second scan line SLb, a narrow portion of the wiring of the second scan line SLb, a portion of the second scan line SLb where the second scan line SLb is bent in a zigzag form and thus a wiring length is increased, and a dummy pixel, etc. In an embodiment, the load matching part LMP includes/is a load matching electrode LMP, which is a lower conductive layer overlapping the second scan line SLb. (See FIGS. 2 and 3)

Accordingly, the gate loading characteristics associated with the second scan line are similar to the gate loading characteristics associated with each of the scan lines SLa to SLc. Advantageously, display quality degradation potentially caused by the presence of the opening area H may be minimized or prevented.

Figure 3:
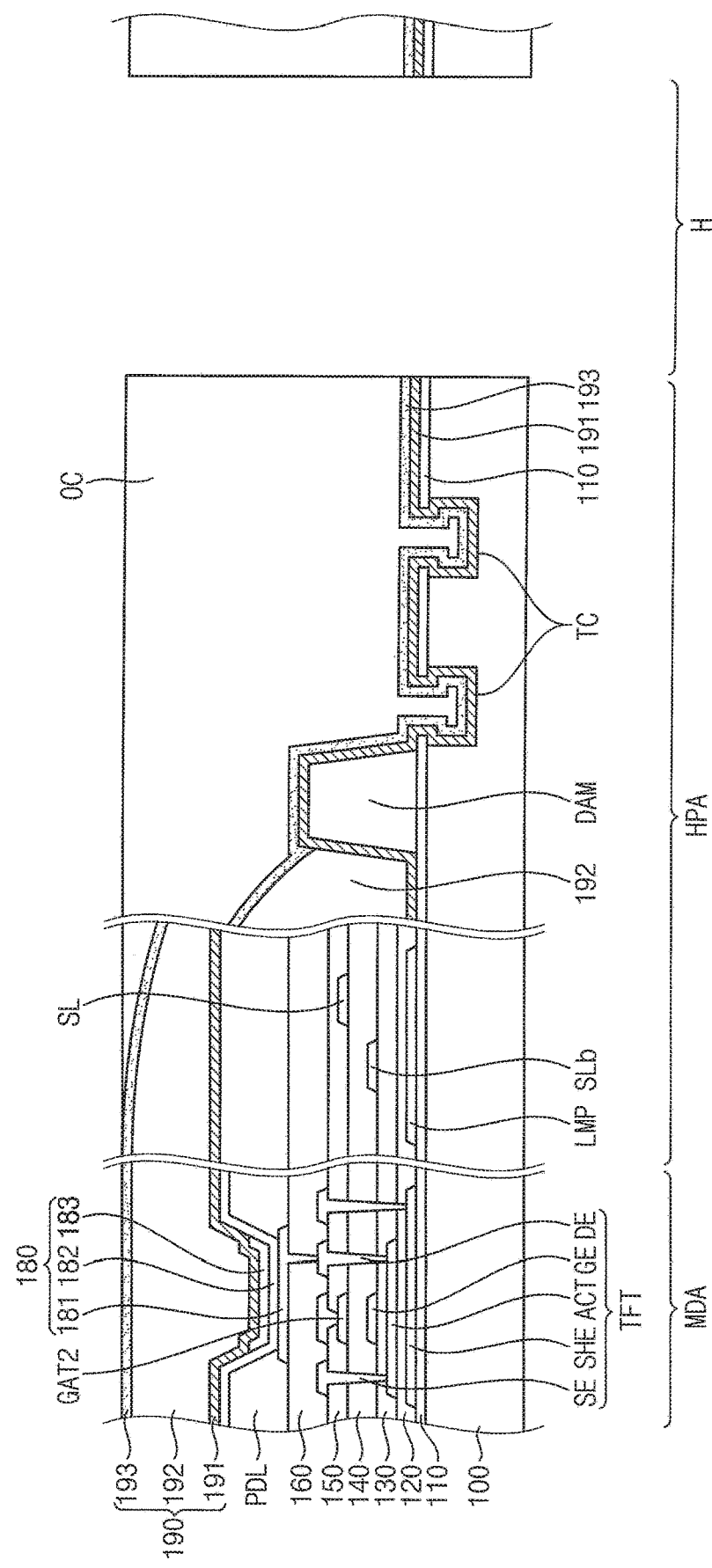
FIG. 3 is a cross-sectional view illustrating an opening of the display apparatus of FIG. 1 and its vicinity according to an embodiment.

FIG. 3 is a cross-sectional view illustrating an opening area H of the display apparatus of FIG. 1 and its vicinity according to an embodiment.

Referring to FIGS. 1 to 3, the display apparatus includes a substrate 100, a buffer layer 110, a lower conductive layer, a lower insulating layer 120, an active pattern ACT, a first gate insulating layer 130, a first gate conductive layer, a second gate insulating layer 140, a second gate conductive layer, an interlayer insulating layer 150, a data conductive layer, a via insulating layer 160, a pixel defining layer PDL, and a light emitting structure 180, a thin film encapsulation layer 190, and an overcoat layer OC.

The substrate 100 may include one or more transparent and/or opaque insulation materials. For example, the substrate 100 may include a quartz substrate, a synthetic quartz substrate, a calcium fluoride substrate, a fluoride-doped quartz substrate, a sodalime glass substrate, a non-alkali glass substrate etc. The substrate 100 may include a flexible transparent material such as a flexible transparent resin substrate (e.g., a polyimide substrate). The polyimide substrate may include a first polyimide layer, a barrier film layer, a second polyimide layer, etc. The substrate 100 may include a first polyimide layer, a first barrier layer disposed on the first polyimide layer, a second polyimide layer disposed on the first barrier layer, and a second barrier layer disposed on the second polyimide layer.

The buffer layer 110 may be disposed on the entire substrate 100. The buffer layer 110 may prevent the diffusion of metal atoms and/or impurities from the substrate 100 into the active pattern ACT. The buffer layer 110 may control a rate of a heat transfer in a crystallization process for forming the active pattern ACT, for obtaining a substantially uniform active pattern ACT. The buffer layer 110 may provide a substantially flat surface over the substrate 100.

The lower conductive layer may be disposed on the buffer layer 110. The lower conductive layer may include a lower shielding electrode SHE and the load matching electrode LMP.

The lower shielding electrode SHE may overlap the active pattern ACT and may prevent the electrical characteristics of the active pattern ACT from significantly deteriorating. For example, in a manufacturing process of the display apparatus 100, the thin film transistor TFT may be protected from laser or moisture flowing from bottom of the substrate 100. The lower shielding electrode SHE may minimize change of threshold voltage of the thin film transistor TFT potentially caused by laser irradiated from the bottom of the substrate 100 to the active pattern ACT. The lower conductive layer may be made of a metal having a low light transmittance. For example, the lower conductive layer may include molybdenum (Mo).

The load matching electrode LMP may overlap the second scan line SLb in the opening peripheral area HPA. Accordingly, a loading capacitance may be formed between the load matching electrode LMP and the second scan line SLb. The load matching electrode LMP may be a floating electrode, or a constant voltage may be applied to the load matching electrode LMP. For example, a power supply voltage (ELVDD, ELVSS, etc.) may be applied to the load matching electrode LMP.

The load matching electrode LMP may be formed along a periphery of the opening peripheral area HPA and/or a periphery of the opening area H in a plan view of the display apparatus.

The lower insulating layer 120 may be disposed on the buffer layer 110 and on the lower conductive layer. The lower insulating layer 120 may prevent the diffusion of metal atoms and/or impurities from the substrate 100 into the active pattern ACT. The lower insulating layer 120 may control a rate of a heat transfer in a crystallization process for forming the active pattern ACT, for obtaining a substantially uniform active pattern ACT.

The active pattern ACT of the thin film transistor TFT may be disposed on the lower insulating layer 120. The active pattern ACT may include amorphous silicon or poly crystal silicon. The active pattern ACT may include an oxide of at least one material selected from the group consisting of indium (In), gallium (Ga), stanium (Sn), zirconium (Zr), vanadium (V), hafnium (Hf), cadmium (Cd), and germanium (Ge), chromium (Cr), titanium (Ti) and zinc (Zn). The active pattern ACT may include drain and source regions doped with an impurity and may include a channel region between the drain region and the source region.

The first gate insulating layer 130 may be disposed on the lower insulating layer 120. The first gate insulating layer 130 may cover the active pattern ACT. The first gate insulating layer 130 may include a silicon compound, a metal oxide, or the like. The first gate insulating layer 130 may include a plurality of layers.

In the drawing, the first gate insulating layer 130 sufficiently covers the active pattern ACT and has a substantially flat upper surface without a step around the active pattern ACT. The first gate insulating layer 130 may cover the active pattern ACT and may have a substantially uniform thickness along a profile of the active pattern ACT.

The first gate conductive layer may be disposed on the first gate insulating layer 130. The first gate conductive layer may include a gate electrode GE of the thin film transistor TFT and scan lines. For example, the first gate conductive layer may include the second scan line SLb. The gate electrode GE may overlap the active pattern ACT. The first gate conductive layer may be formed of a metal, an alloy, a metal nitride, a conductive metal oxide, a transparent conductive material, or the like.

The second gate insulating layer 140 may be disposed on the first gate insulating layer 130 and the first gate conductive layer. The second gate insulating layer 140 may include a silicon compound, a metal oxide, or the like. The second gate insulating layer 140 may include a plurality of layers.

In the drawing, the second gate insulating layer 140 sufficiently covers the gate electrode GE and has a substantially flat upper surface without a step around the gate electrode GE. The second gate insulating layer 140 may cover the first gate conductive pattern and may have a substantially uniform thickness along a profile of the gate electrode GE.

The second gate conductive layer may be disposed on the second gate insulating layer 140. The second gate conductive layer may include an electrode GAT2 overlapping the gate electrode GE to form a storage capacitor and may include scan lines SL. For example, a scan line SL may be adjacent to the second scan line SLb. The second gate conductive layer may be formed of a metal, an alloy, a metal nitride, a conductive metal oxide, a transparent conductive material, or the like.

The interlayer insulating layer 150 may be disposed on the second gate insulating layer 140 and on the second gate conductive layer. The interlayer insulating layer 150 may sufficiently cover the second gate conductive layer and may have a substantially flat upper surface without a step around the second gate conductive layer. The interlayer insulation layer 140 may cover the second gate conductive layer and may have a substantially uniform thickness along a profile of the second gate conductive layer. The interlayer insulating layer 150 may include a plurality of layers.

The data conductive layer may be disposed on the interlayer insulating layer 150. The first data conductive layer may include source and drain electrodes of the thin film transistor TFT. The source and drain electrodes are electrically connected to the active pattern ACT through contact holes formed through the first gate insulating layer 130, the second gate insulating layer 140, and the interlayer insulating layer 150. The first conductive layer may include data lines. The data conductive layer may be formed of a metal, an alloy, a metal nitride, a conductive metal oxide, a transparent conductive material, or the like.

The via insulation layer 160 may be disposed on the interlayer insulating layer 150 and on the data conductive layer. The via insulation layer 160 may have a single-layered structure or a multi-layered structure including at least two insulation films. The via insulation layer 160 may be formed of an organic material. For example, the via insulation layer 160 may include photoresist, acryl-based resin, polyimide-based resin, polyamide-based resin, siloxane-based resin, etc. The via insulation layer 160 may include inorganic material such as a silicon compound, metal oxide, etc.

The light emitting structure 180 may include a first electrode 181, an emission layer 182, and a second electrode 183.

The first electrode 181 may be disposed on the via insulation layer 160. The first electrode 181 may include a reflective material or a transmissive material in accordance with the emission type of the display apparatus. For example, the second electrode 183 may include at least one of aluminum, an alloy containing aluminum, aluminum nitride, silver, an alloy containing silver, tungsten, tungsten nitride, copper, an alloy containing copper, nickel, chromium, chromium nitride, molybdenum, alloys containing titanium, titanium nitride, platinum, tantalum, tantalum nitride, neodymium, scandium, strontium ruthenium oxide, zinc oxide, indium tin oxide, tin oxide, indium oxide, gallium oxide, indium Zinc oxide, and the like. The first electrode 181 may have a single layer structure or a multi-layer structure, which may include a metal film, an alloy film, a metal nitride film, a conductive metal oxide film and/or a transparent conductive film.

The pixel defining layer PDL may be disposed on the via insulation layer 160 and may partially overlap the first electrode 181. The pixel defining layer PDL may be formed of an organic material. For example, the pixel defining layer PDL may include photoresist, acryl-based resin, polyimide-based resin, polyamide-based resin, siloxane-based resin, etc. An opening which exposes the first electrode 181 may be formed by etching the pixel defining layer PDL. An emitting area and a non-emitting area of the display apparatus may be defined by the opening of the pixel defining layer PDL. For example, the opening of the pixel defining layer PDL may correspond to an emitting area of the display apparatus, and a non-emitting area of the display apparatus may be adjacent to the opening of the pixel defining layer PDL.

The light emitting layer 182 may be disposed on a portion of the first electrode 181 exposed through the opening of the pixel defining layer PDL. The light emitting layer 182 may extend on a sidewall of the opening of the pixel defining layer PDL. The light emitting layer 182 may include an organic light emitting layer (EL), a hole injection layer (HIL), a hole transfer layer (HTL), an electron transfer layer (ETL), an electron injection layer (EIL), etc. In some example embodiments, the hole injection layer, the hole transport layer, the electron transport layer, and the electron injection layer may correspond to a plurality of pixels. A plurality of organic light emitting layers may be formed of light emitting materials for generating different colors of light such as a red light, a green light, and a blue light in accordance with color pixels of the display device. The organic light emitting layer of the of the light emitting layer 182 may include a plurality of stacked light emitting materials for generating a red light, a green light, and a blue light for emitting a white light. Elements of the light emitting layer 182 may correspond to a plurality of pixels, and different pixels may include different color filter layers for displaying different colors.

The second electrode 183 may be disposed on the pixel defining layer PDL and the light emitting layer 182. The second electrode 183 may include a transmissive material or a reflective material in accordance with the emission type of the display device. For example, the second electrode 183 may include at least one of aluminum, an alloy containing aluminum, aluminum nitride, silver, an alloy containing silver, tungsten, tungsten nitride, copper, an alloy containing copper, nickel, chromium, chromium nitride, molybdenum, alloys containing titanium, titanium nitride, platinum, tantalum, tantalum nitride, neodymium, scandium, strontium ruthenium oxide, zinc oxide, indium tin oxide, tin oxide, indium oxide, gallium oxide, indium Zinc oxide, and the like. The second electrode 183 may also have a single layer structure or a multi-layer structure, which may include a metal film, an alloy film, a metal nitride film, a conductive metal oxide film and/or a transparent conductive film.

A pixel circuit including the thin film transistor TFT in the main display area MDA and the light emitting structure 180 may correspond to one pixel PX for displaying a portion of an image.

A dam DAM may surround the opening area H and may be positioned in the opening peripheral area HPA. The dam DAM may control a formation position of the organic layer 192 of the thin film encapsulation layer 190 to prevent formation of an organic edge tail. The dam DAM may be formed using the same material layers as the via insulating layer 160 and the pixel defining layer PDL.

The thin film encapsulation layer 190 may be disposed on the second electrode 183. The thin film encapsulation layer 190 may prevent penetration of moisture and oxygen from the environment of the display apparatus. The thin film encapsulation layer 190 may include at least one organic layer and at least one inorganic layer. The at least one organic layer and the at least one inorganic layer may be alternately stacked. For example, the thin film encapsulation layer TFE may include a first inorganic layer 191, a second inorganic layer 193, and an organic layer 192 between the first inorganic layer 191 and the second inorganic layer 193. In some example embodiments, it is possible to provide a sealing substrate (instead of the thin film encapsulation layer 190) for shielding outside air and moisture from penetrating into the display apparatus.

The overcoat layer OC may be formed on the opening peripheral area HPA on the second inorganic layer 193 to compensate for the overall height of the display apparatus.

In the opening peripheral area HPA, a groove TC surrounding the opening area H (in a plan view) may be formed on the substrate 100. The inorganic layers 191 and 193 of the thin film encapsulation layer 190 may extend along side surfaces of the groove TC. In this case, a path for a moisture inflow, an oxygen inflow, and/or a crack through the inorganic layers 191 and 193 may be sufficiently extended. Accordingly, in a region adjacent to the opening area H, moisture, oxygen, and cracks may not reach the internal elements along the inorganic layers 191 and 193. Thus, the display apparatus may have satisfactory reliability and stability.

According to an embodiment, since the display apparatus includes the load matching part in the opening peripheral area HPA, the gate loading deviation due to the opening area H may be compensated for. The load matching part may be/include the load matching electrode LMP of the lower conductive layer in the opening peripheral area HPA, for minimizing the size of the non-display opening peripheral area HPA.

Figure 4:
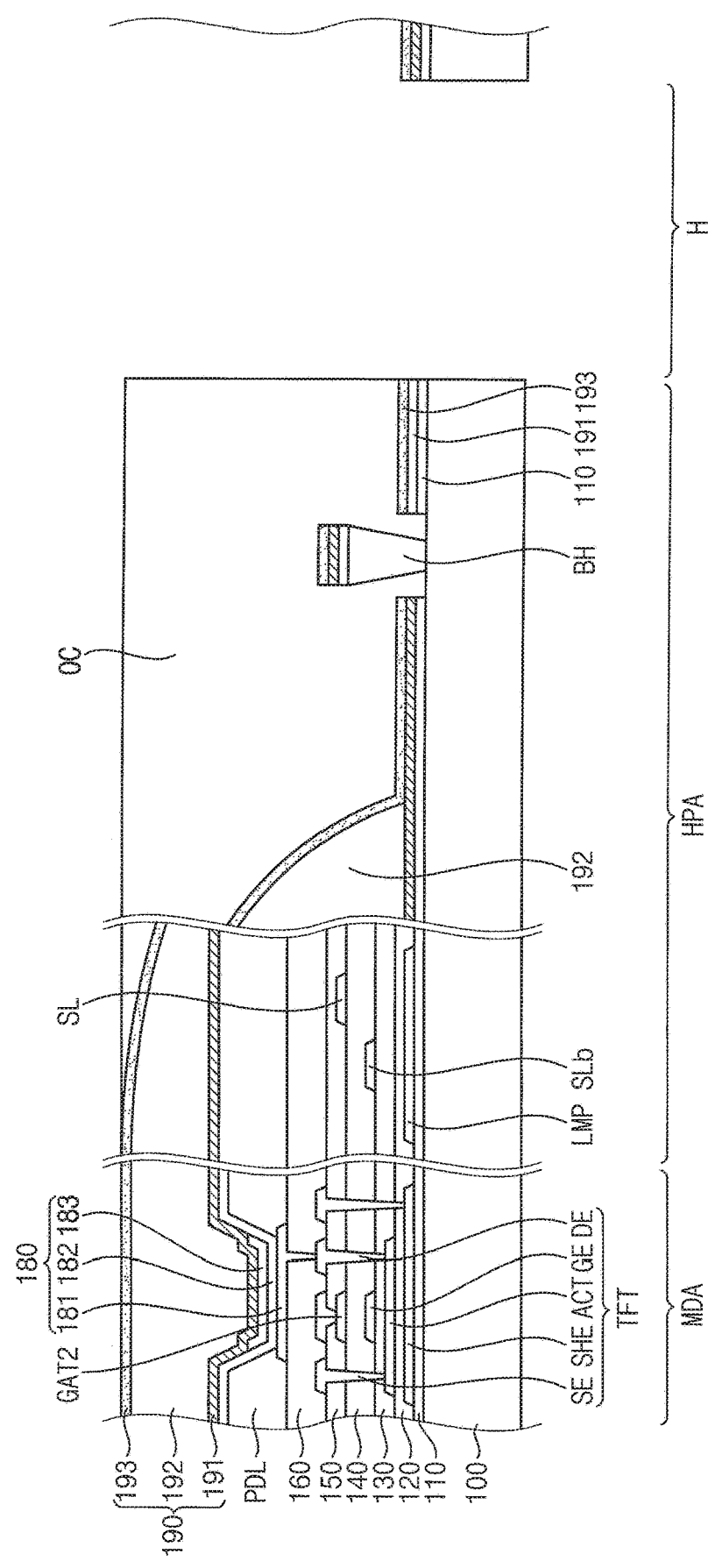
FIG. 4 is a cross-sectional view illustrating an opening of a display apparatus and its vicinity according to an embodiment.

FIG. 4 is a cross-sectional view illustrating an opening area H of a display apparatus and its vicinity according to an embodiment.

Referring to FIG. 4, the display apparatus is substantially the same as and/or analogous to the display apparatus of FIGS. 1 to 3 except a partition wall BH instead of a groove and a dam.

An organic layer 192 of a thin film encapsulation layer 190 may be patterned so that the organic layer 192 may not overlap the partition wall BH.

Portions of the inorganic layers 191 and 193 of the thin film encapsulation layer 190 overlap the partition wall BH. Portions of the inorganic layers 191 and 193 may be formed along a tapered surface of the partition wall BH. In this case, the organic light emitting diode display apparatus may have a long path for moisture, oxygen, and/or cracks through the inorganic layers 191 and 193. Accordingly, in a region adjacent to the opening area H, moisture, oxygen, and cracks may not reach the internal elements along the f inorganic layers 191 and 193. Thus, the display apparatus may have satisfactory reliability and stability.

Figure 5:
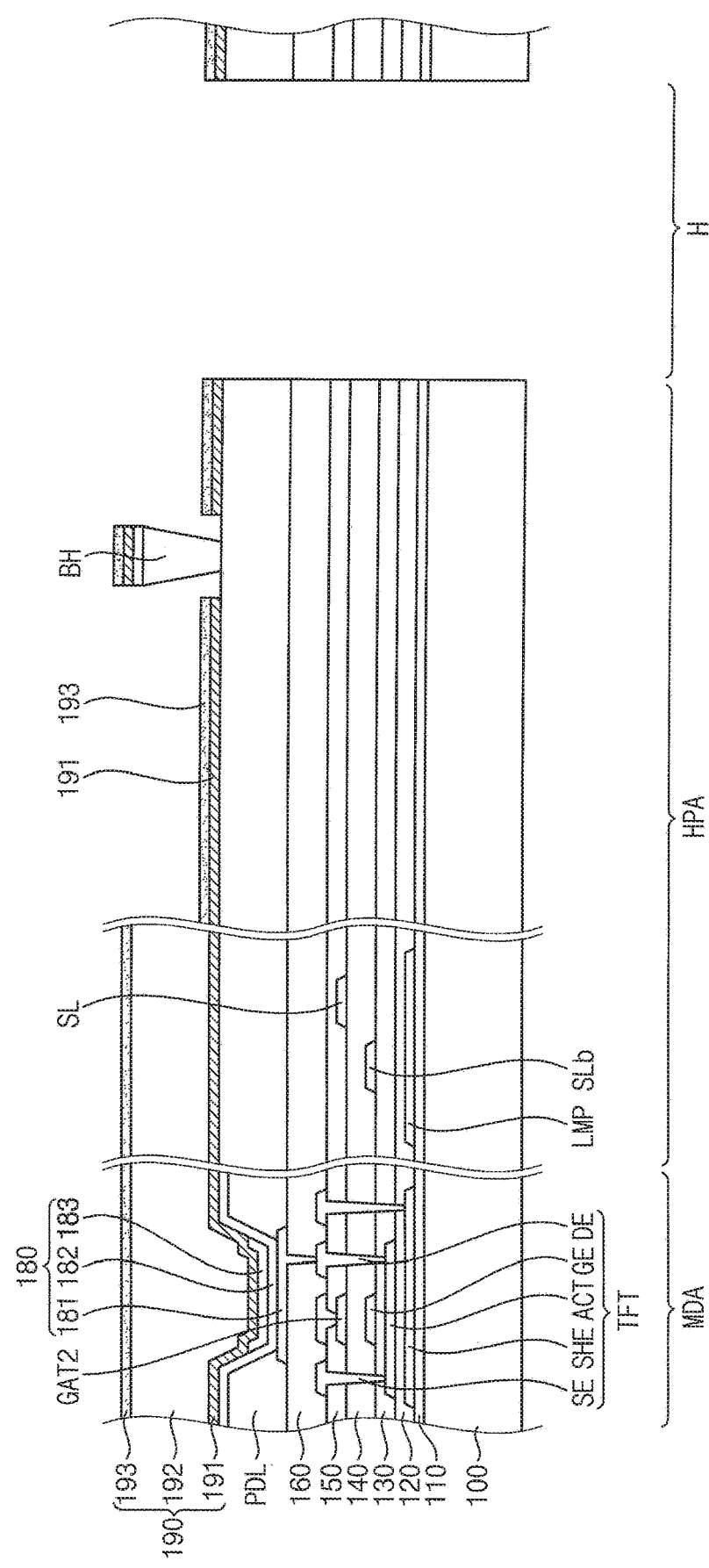
FIG. 5 is a cross-sectional view illustrating an opening of a display apparatus and its vicinity according to an embodiment.

FIG. 5 is a cross-sectional view illustrating an opening area H of a display apparatus and its vicinity according to an embodiment.

The display apparatus is substantially the same as and/or analogous to the display device of FIGS. 1 to 3 except a partition wall BH instead of a dam and a groove.

A lower insulating layer 120, a first gate insulating layer 130, a second gate insulating layer 140, an interlayer insulating layer 150, a via insulating layer 160, and a pixel defining layer PDL may extend to a peripheral area of the opening HPA. The partition wall BH may protrude over the above-mentioned layers so as to separate portions of the layers in the opening peripheral area HPA.

For example, the partition wall BH may separate portions of the inorganic layers 191 and 193 of the thin film encapsulation layer 190 in the opening peripheral area HPA. Accordingly, water, oxygen, and/or cracks may not transmit/propagate along the inorganic layers 191 and 193 in the opening peripheral area HPA. Advantageously, the display apparatus may have satisfactory reliability and stability. The partition wall BH may serve as a spacer for preventing a mask from directly touching elements of the display apparatus during the manufacturing of the display apparatus.

Figure 6:
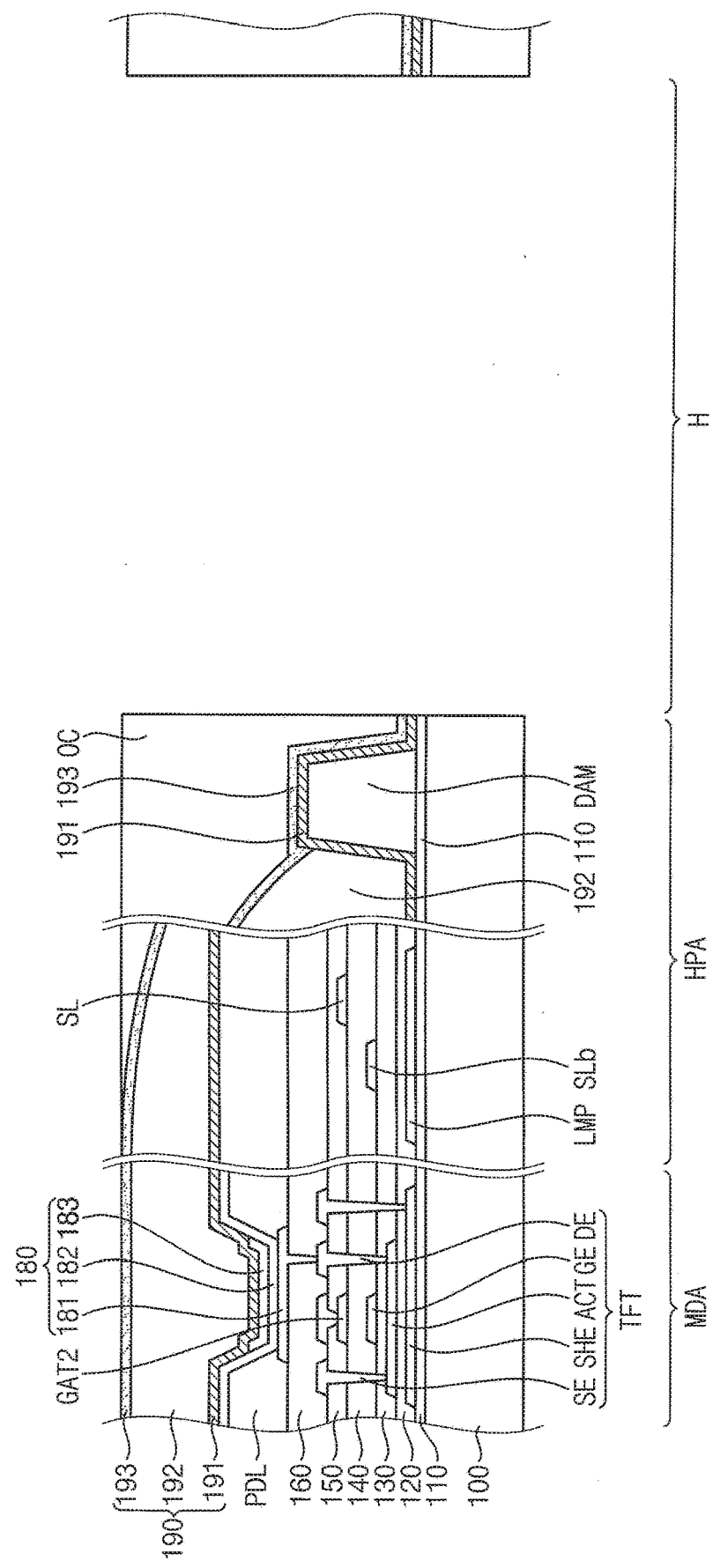
FIG. 6 is a cross-sectional view illustrating an opening of a display apparatus and its vicinity according to an embodiment.

FIG. 6 is a cross-sectional view illustrating an opening area H of a display apparatus and its vicinity according to an embodiment.

Referring to FIG. 6, the display apparatus is substantially the same as and/or analogous to the display apparatus of FIGS. 1 to 3 except for structures between the dam and the opening area H. The substrate 100 may not include grooves between the dam DAM and the opening area H.

Figure 7:
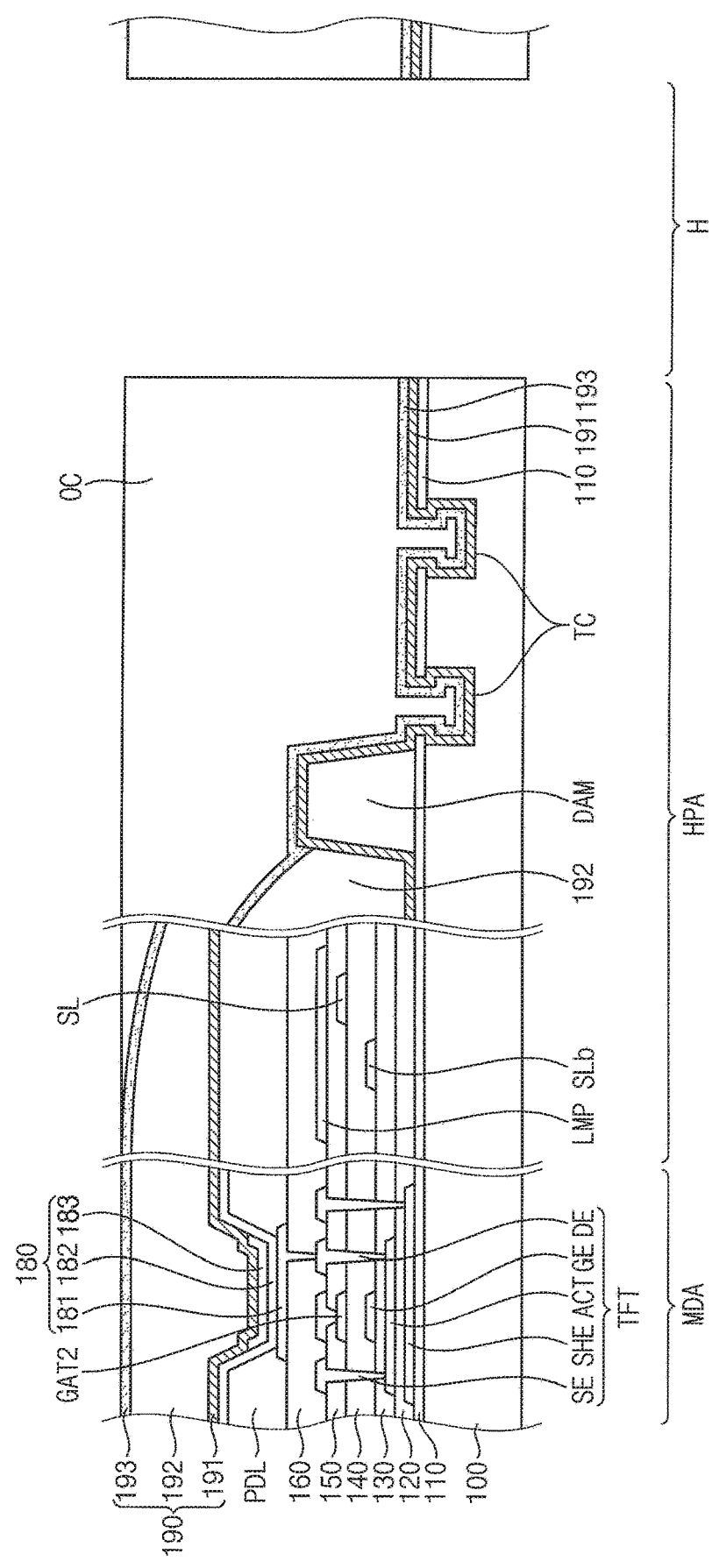
FIG. 7 is a cross-sectional view illustrating an opening of a display apparatus and its vicinity according to an embodiment.

FIG. 7 is a cross-sectional view illustrating an opening area H of a display apparatus and its vicinity according to an embodiment.

Referring to FIG. 7, the display apparatus is substantially the same as and/or analogous to the display apparatus of FIGS. 1 to 3 except that a load matching electrode LMP is included in the data conductive layer instead of the lower conductive layer.

The load matching electrode LMP may be formed in the first gate conductive layer or in the second gate conductive layer.

Figure 8:
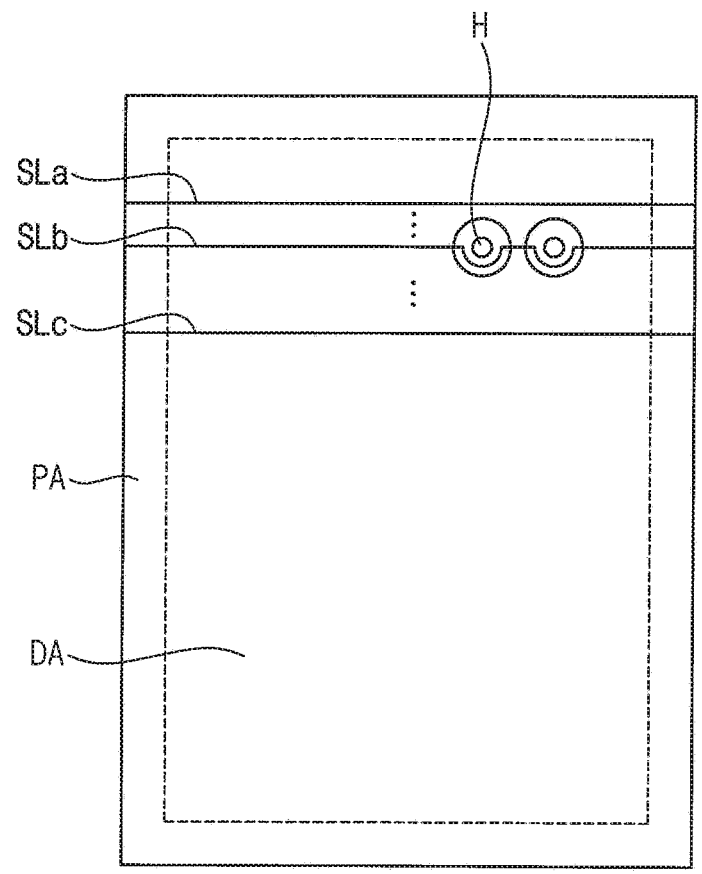
FIG. 8 is a plan view illustrating a display apparatus according to an embodiment.
Figure 9:
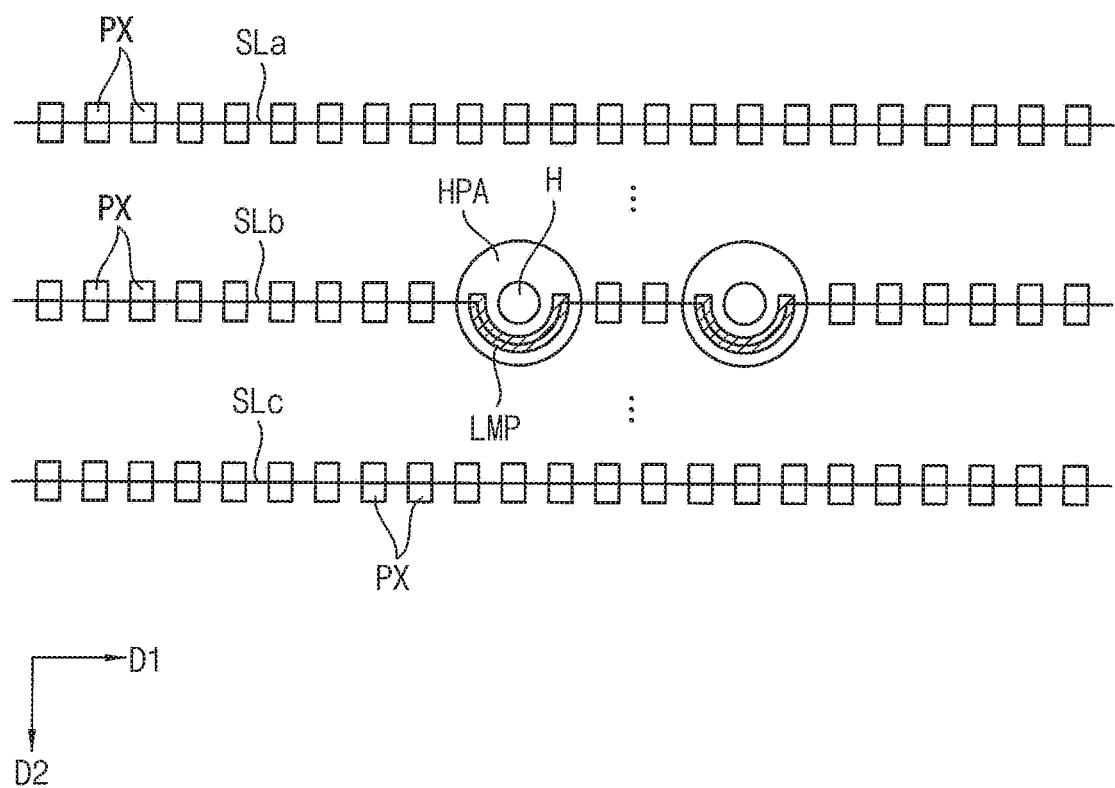
FIG. 9 is a plan view illustrating an opening of the display apparatus of FIG. 8 and its vicinity according to an embodiment.

FIG. 8 is a plan view illustrating a display apparatus according to an embodiment. FIG. 9 is a plan view illustrating an opening area H of the display apparatus of FIG. 8 and its vicinity according to an embodiment.

Referring to FIGS. 8 and 9, the display apparatus may include a display area DA and may include a non-display peripheral area PA surrounding the display area DA.

A plurality of pixels PX may be disposed in the display area DA to display an image. The display area DA may have a substantially rectangular shape that has a long side extending in a second direction D2 and has a short side extending in a first direction D1.

The display apparatus may include an opening area H for installing an optical module and may include a non-display opening peripheral area HPA surrounding the opening area H. The opening area H of the substrate may transmit light. For example, a circular hole may be formed in the opening area H and may extend through the substrate, and/or a transparent window may be formed in the opening area H.

The display apparatus may further include a signal line (e.g., a scan line) electrically connected to some of the pixels and may include a load matching part LMP disposed in the opening peripheral area HPA.

Scan lines may be respectively electrically connected to subsets of the pixels PX. For example, the scan lines may include a first scan line SLa, a second scan line SLb, and a third scan line SLc.

The load matching part LMP may be/include at least one of a load matching electrode forming a loading capacitor with the second scan line SLb, a narrow portion of the wiring of the second scan line SLb, a portion of the second scan line SLb where the second scan line SLb is bent in a zigzag form and thus a wiring length is increased, and a dummy pixel, etc.

Figure 10:
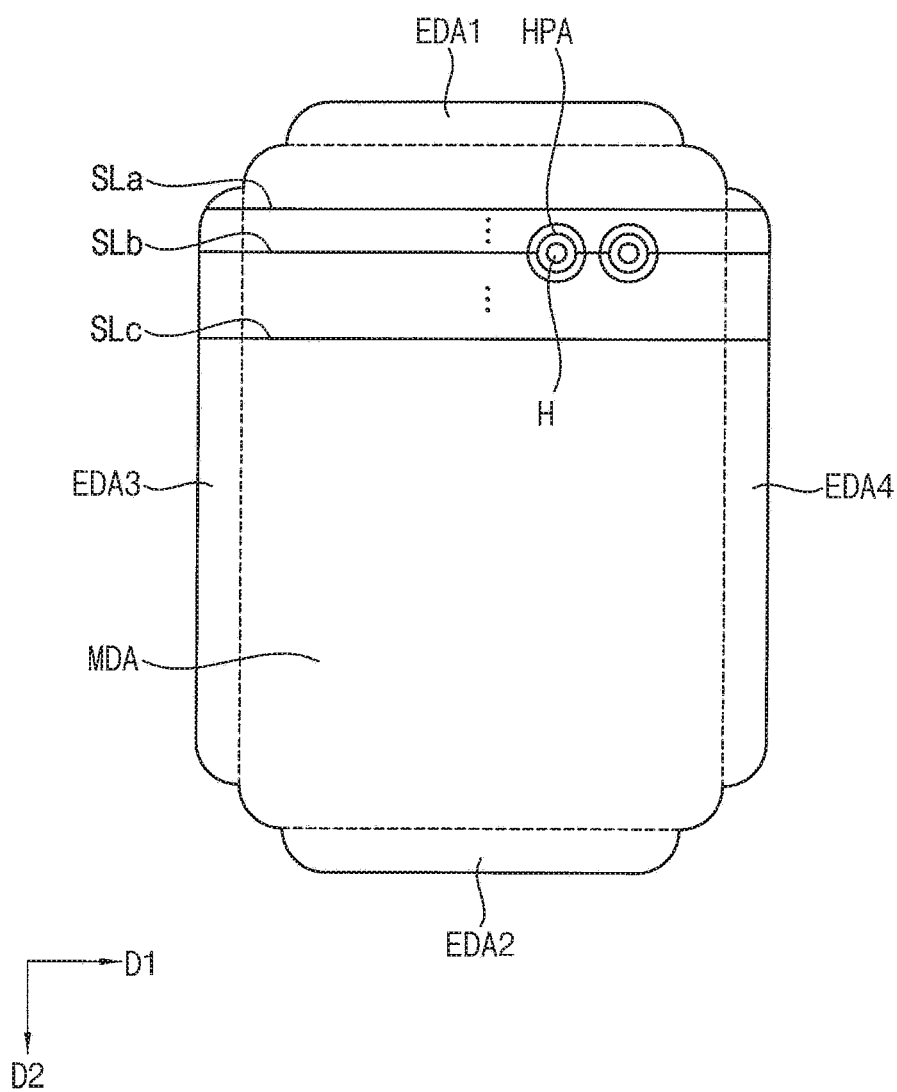
FIG. 10 is a plan view illustrating a display apparatus according to an embodiment.
Figure 11:
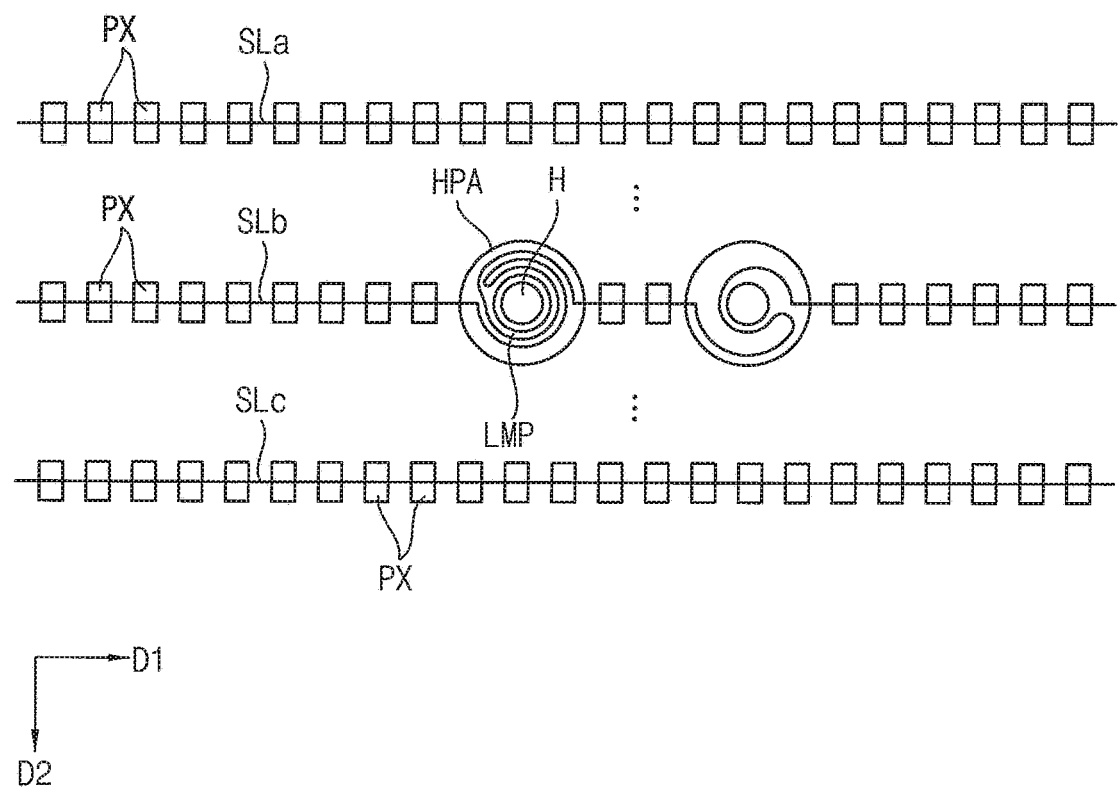
FIG. 11 is a plan view illustrating an opening of the display apparatus of FIG. 10 and its vicinity according to an embodiment.

FIG. 10 is a plan view illustrating a display apparatus according to an embodiment. FIG. 11 is a plan view illustrating an opening area H of the display apparatus of FIG. 10 and its vicinity according to an embodiment.

Referring to FIGS. 10 and 11, the display apparatus may include a main display area MDA, a first edge display area EDA1, a second edge display area EDA2, a third edge display area EDA3, and a fourth edge display area EDA4. A non-display peripheral area may be formed along an edge of the display apparatus.

The main display area MDA may include an opening area H for installing an optical module and may include a non-display opening peripheral area HPA surrounding the opening area H. The opening area H may transmit light. For example, a circular hole penetrating the substrate and/or a transparent window may be formed in the opening area H.

The display apparatus may include a signal line (e.g., a scan line) electrically connected to some of the pixels PX in the main display area MDA and may include a load matching part LMP disposed in the opening peripheral area HPA.

Scan lines may be respectively electrically connected to subset of the pixels PX of the display apparatus. For example, the scan lines may include a first scan line SLa, a second scan line SLb, and a third scan line SLc. The scan lines SLa to SLc may substantially extend in the first direction D1 and may be arranged in the second direction D2.

The first scan line SLa and the third scan line SLc do not pass through the opening peripheral area HPA. The second scan line SLb may pass through the opening peripheral area HPA. A portion of the second scan line SLb may be disposed in the opening peripheral area HPA and may function as and/or electrically connect to the load matching part LMP.

The second scan line SLb and/or the load matching part LMP may substantially surround the opening peripheral area HPA a plurality of times. Accordingly, the second scan line SLb (including and/or connected to the load matching part LMP) may be longer than each of the first scan line SLa or the third scan line SLc. Advantageously, loads associated with the scan lines may be substantially matched, and satisfactory image display quality may be attained. The display apparatus may further include a load matching electrode overlapping the portion of the second scan line SLb in the opening peripheral area HPA.

Figure 12A:
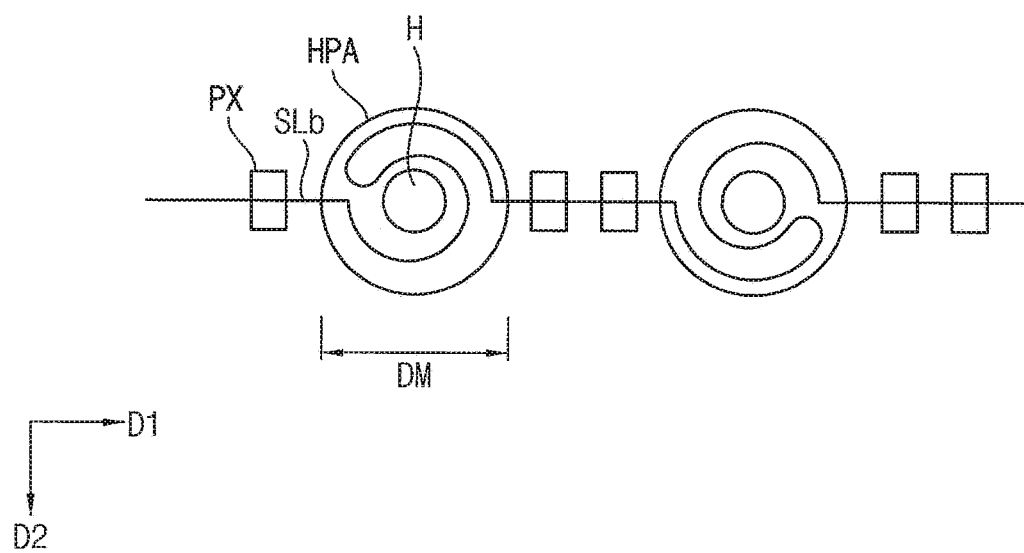
FIG. 12A is a plan view illustrating an opening of a display apparatus and its vicinity according to an embodiment.
Figure 12B:
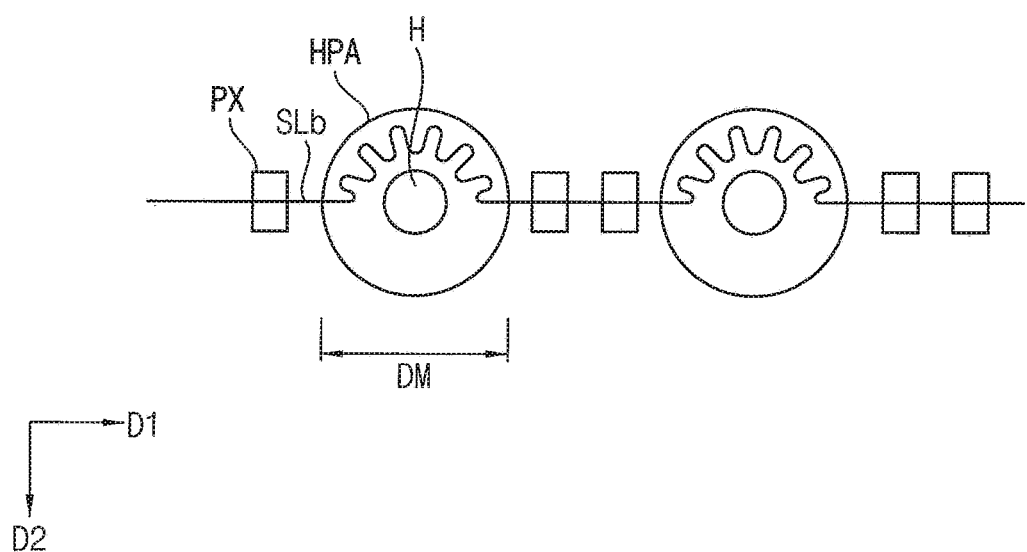
FIG. 12B is a plan view illustrating an opening of a display apparatus and its vicinity according to an embodiment.
Figure 12C:
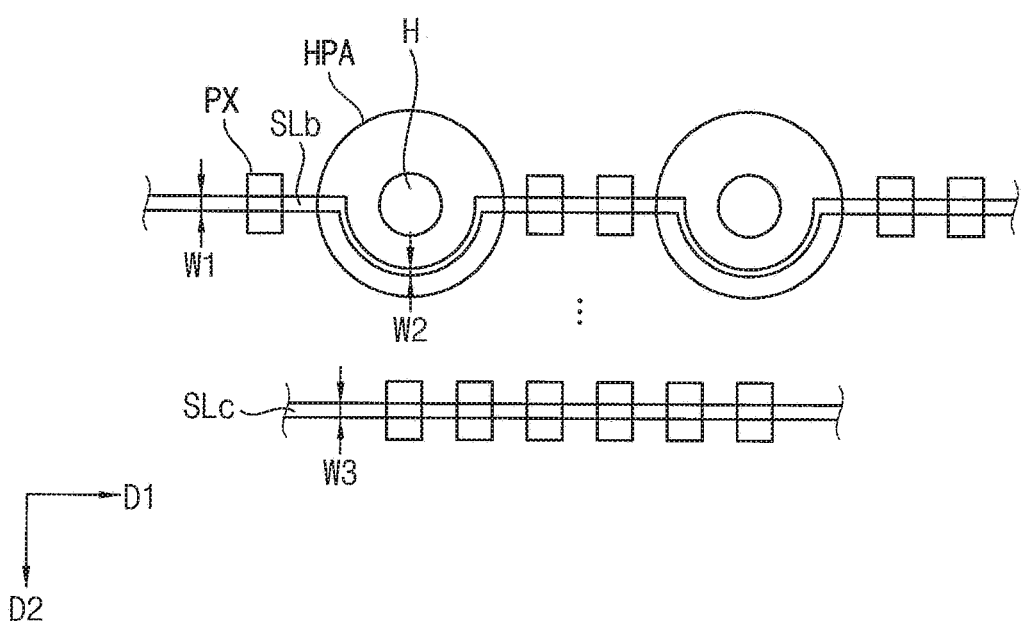
FIG. 12C is a plan view illustrating an opening of a display apparatus and its vicinity according to an embodiment.

FIG. 12A is a plan view illustrating an opening area H of a display apparatus and its vicinity according to an embodiment. FIG. 12B is a plan view illustrating an opening area H of a display apparatus and its vicinity according to an embodiment. FIG. 12C is a plan view illustrating an opening area H of a display apparatus and its vicinity according to an embodiment.

Referring to FIGS. 12A and 12B, the display apparatus is substantially the same as and/or analogous to the display apparatus of FIG. 11 except for a shape of a portion of a second scan line SLb in an opening peripheral area HPA. Referring to FIGS. 11 to 12B, the second scan line SLb bent in various shapes in the opening peripheral area HPA to be longer than each of the scan lines SLa and SLc.

Referring to FIG. 12C, the display apparatus is substantially the same as and/or analogous to the display apparatus of FIG. 11, except that a second width w2 of the second scan line SLb in the peripheral area HPA is smaller than a first width w1 of the second scan line SLb in the display area and/or smaller than a third width w3 of the third scan line SLc. Thus, loads associated with the scan lines may be substantially matched, and satisfactory image display quality may be attained.

Figure 13:
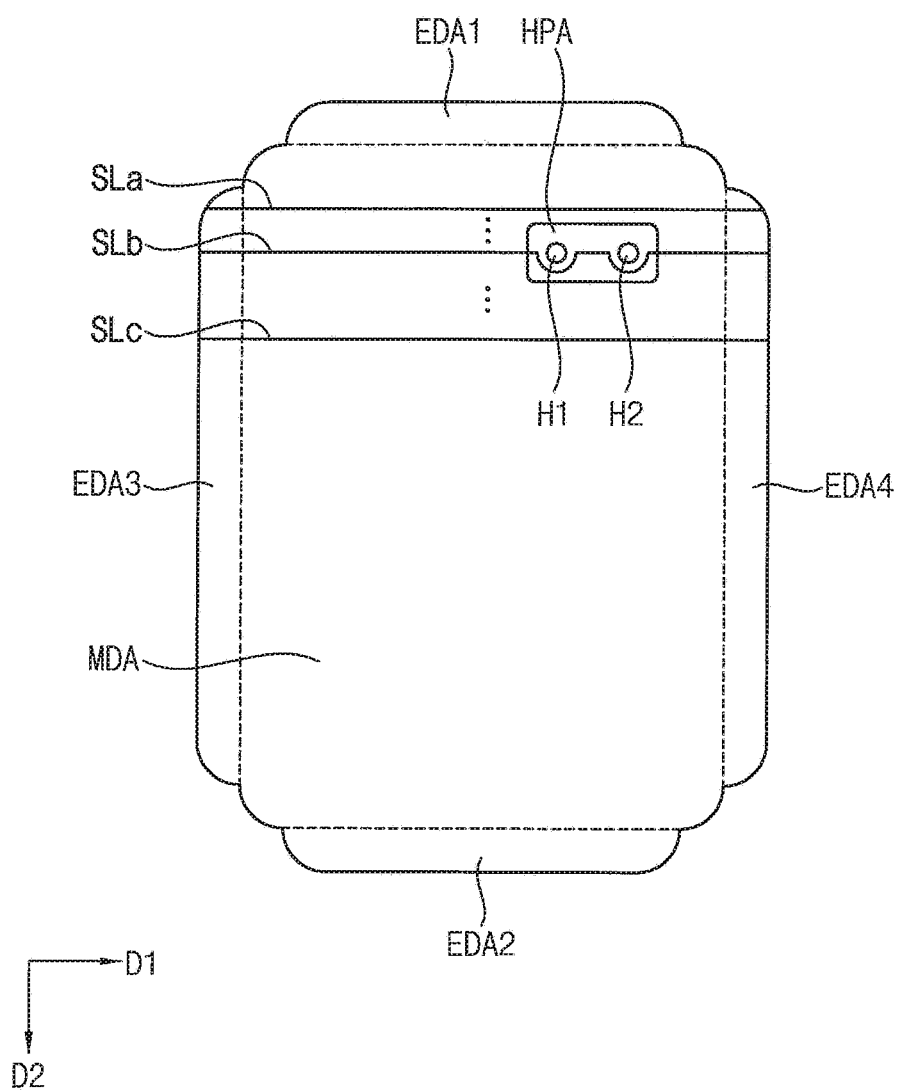
FIG. 13 is a plan view illustrating a display apparatus according to an embodiment.
Figure 14:
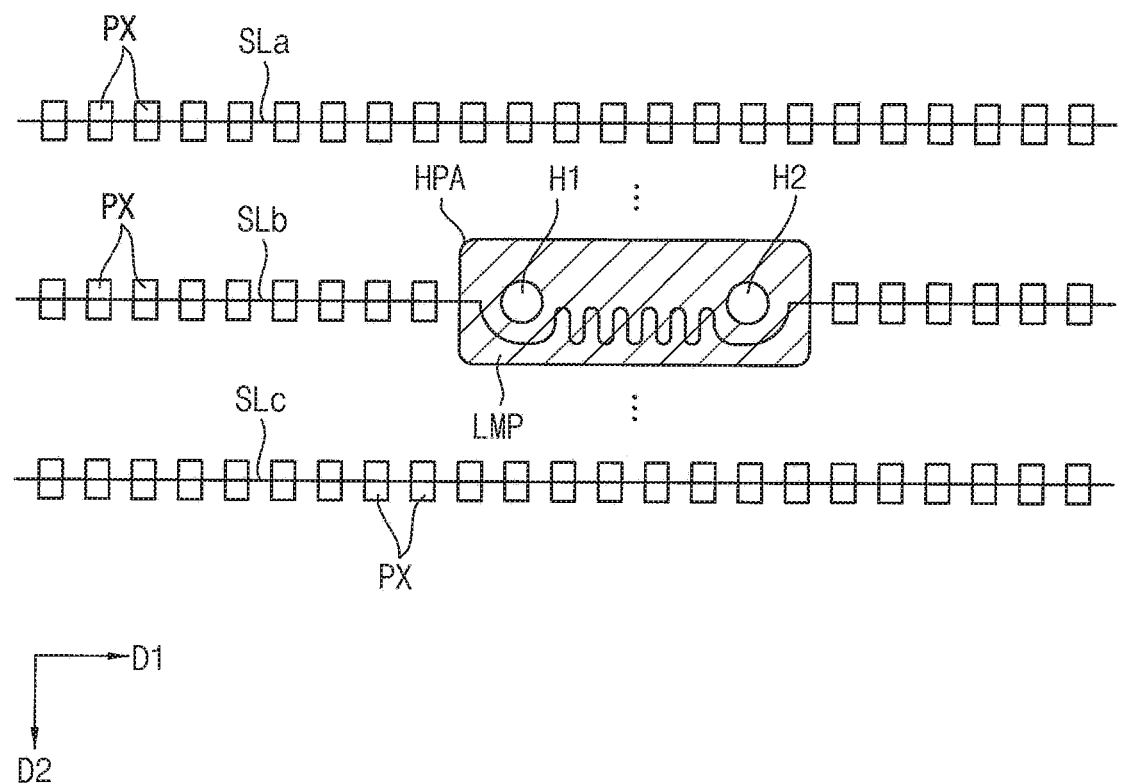
FIG. 14 is a plan view illustrating first and second openings of the display apparatus of FIG. 13 and vicinity according to an embodiment.

FIG. 13 is a plan view illustrating a display apparatus according to an embodiment. FIG. 14 is a plan view illustrating first and second opening areas H1 and H2 of the display apparatus of FIG. 13 and its vicinity according to an embodiment.

Referring to FIGS. 13 and 14, the display apparatus is substantially the same as and/or analogous to the display apparatus of FIGS. 1 to 3 except for the first opening area H1, the second opening area H2, and the opening peripheral area HPA.

The display apparatus has a first opening area H1 for installing an optical/functional module, a second opening area H2 spaced apart from the first opening area H1 for accommodating an optical/functional module, and a non-display opening peripheral area HPA surrounding the first opening area H1 and the second opening area H2. The opening areas H1 and H2 may transmit light. For example, at least one circular hole penetrating the substrate and/or at least one transparent window may be formed in the opening areas H1 and H2.

An optical/functional module (not shown) may overlap or may be disposed inside at least one of the opening area H1 and H2. For example, the optical/functional module may include at least one of a camera module for capturing (or recognizing) an image of an object, a face recognition sensor module for sensing a face of a user, a pupil recognition sensor module for sensing a pupil of a user, acceleration and geomagnetic sensor modules for determining movement of the display apparatus, proximity and infrared sensor modules for detecting proximity to the display apparatus, and a light intensity sensor module for measuring the degree of brightness (when left in a pocket or a bag), etc. Different optical/functional modules may correspond to and/or may be disposed in the first opening area H1 and the second opening area H2.

The display apparatus may include a signal line (e.g., a scan line) electrically connected to some of the pixels PX in the main display area MDA and may include a load matching part LMP disposed in the opening peripheral area HPA.

The display apparatus may include a first scan line SLa, a second scan line SLb, and a third scan line SLc The first scan line SLa and the third scan line SLc do not pass through the opening peripheral area HPA. The second scan line SLb may pass through the opening peripheral area HPA. A portion of the second scan line SLb may be disposed in the opening peripheral area HPA.

The load matching part LMP may be a load matching electrode forming a loading capacitor with the second scan line SLb, a narrow portion of the wiring of the second scan line SLb, a portion of the second scan line SLb where the second scan line SLb is bent in a zigzag form and thus a wiring length is increased, and a dummy pixel, etc. The load matching part LMP may include a load matching electrode (in a lower conductive layer analogous to the lower conductive layer illustrated in FIG. 3) overlapping a zigzag structure of the second scan line SLb. The load matching part LMP may include a load matching electrode and may include a zigzag structure that is electrically connected to the second scan line SLb and overlaps the load matching electrode.

Figure 15:
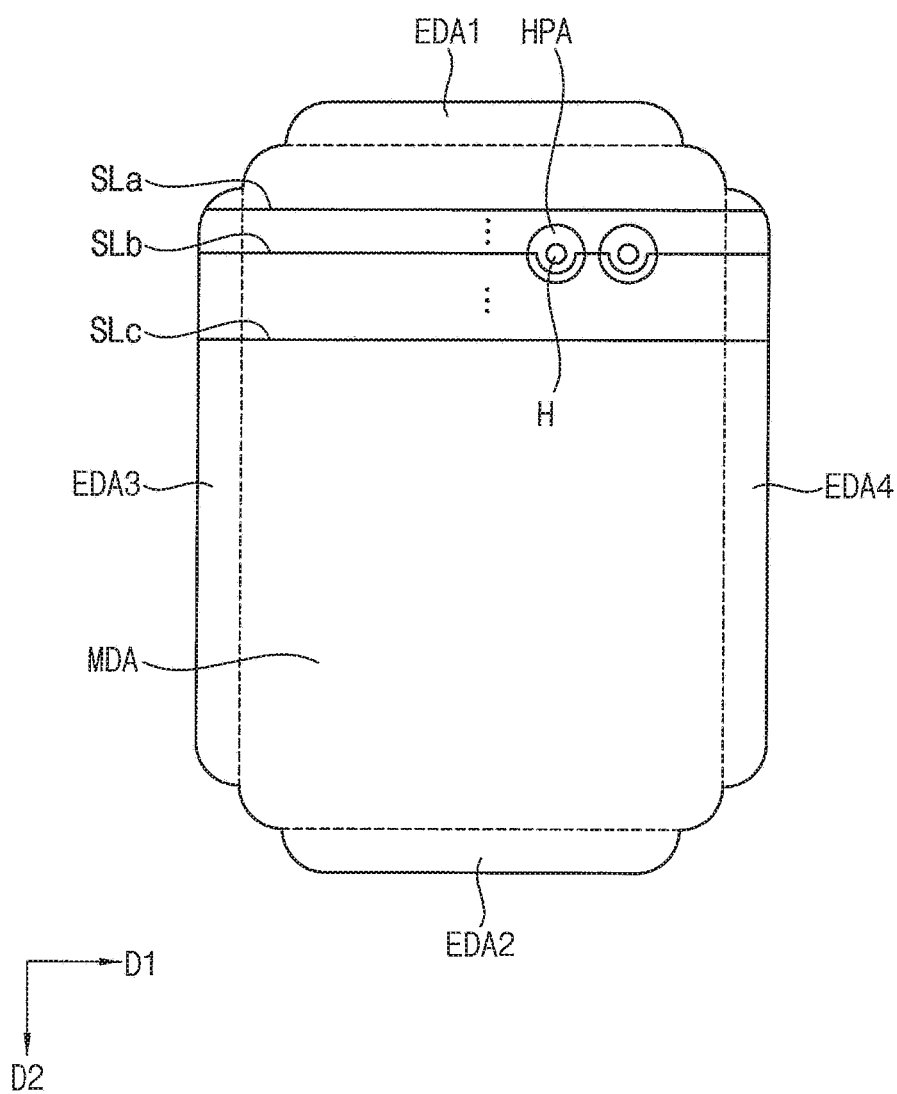
FIG. 15 is a plan view illustrating a display apparatus according to an embodiment.
Figure 16:
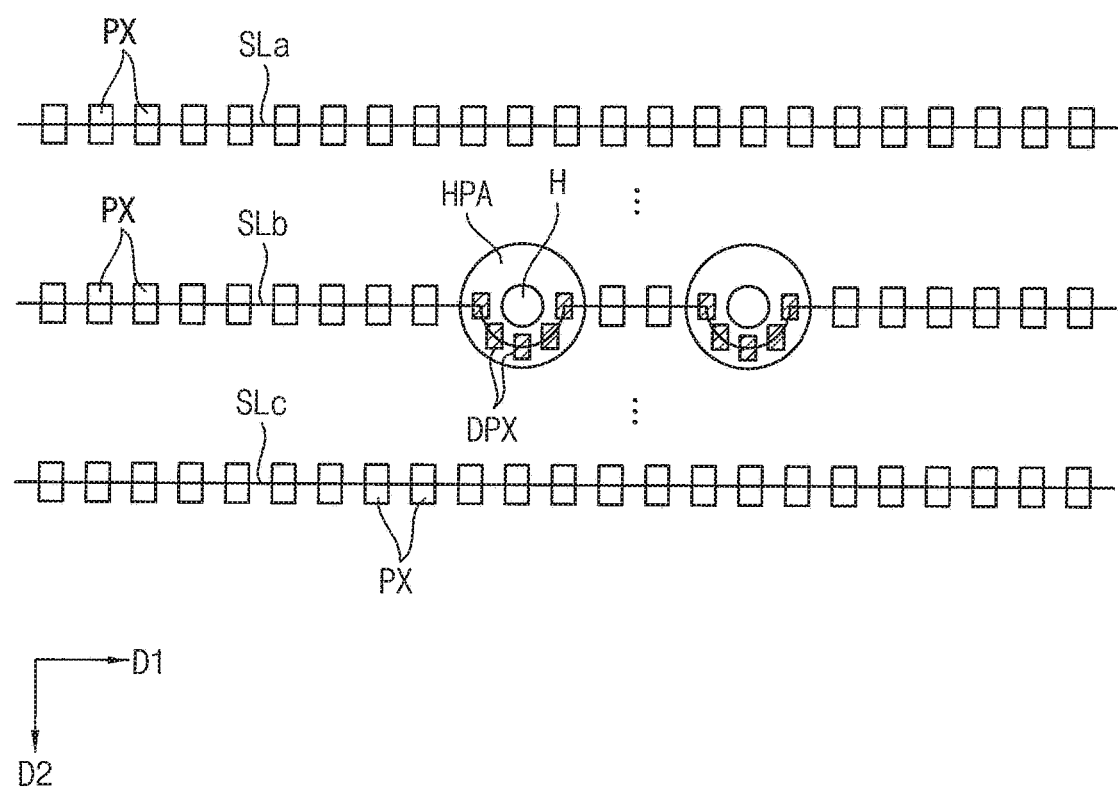
FIG. 16 is a plan view illustrating an opening of the display apparatus of FIG. 15 and its vicinity according to an embodiment.

FIG. 15 is a plan view illustrating a display apparatus according to an embodiment. FIG. 16 is a plan view illustrating an opening area H of the display apparatus of FIG. 15 and its vicinity according to an embodiment.

Referring to FIGS. 15 and 16, the display apparatus is substantially the same as and/or analogous to the display apparatus of FIGS. 1 to 3 except that one or more dummy pixels DPX function as at least a portion of a load matching part.

At least one dummy pixel DPX may be electrically connected to the second scan line SLb and may be disposed in the opening peripheral area HPA. A dummy pixel DPX may have a structure and/or a load that is equal to that of an image-displaying pixel PX. A pixel circuit of a dummy pixel PX may be substantially the same as a pixel circuit of a pixel PX. A sum of the number of dummy pixels DPX and the number of pixels PX connected to the second scan line SLb may be equal to the number of pixels PX connected to each of the scan lines SLa and SLc. A sum of the load of dummy pixels DPX and the load of pixels PX provided to the second scan line SLb may be equal to the load of pixels PX provided to each of the scan lines SLa and SLc.

Figure 17:
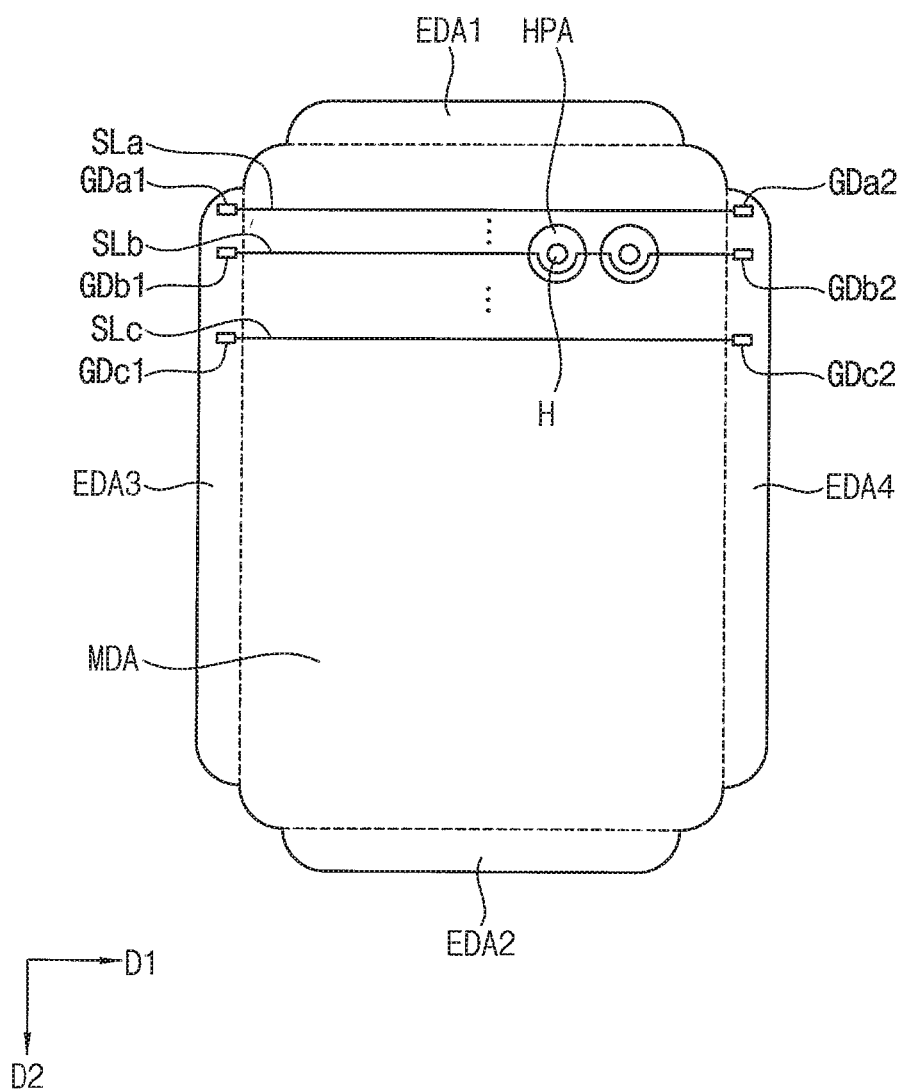
FIG. 17 is a plan view illustrating a display apparatus according to an embodiment.

FIG. 17 is a plan view illustrating a display apparatus according to an embodiment.

Referring to FIG. 17, the display apparatus is substantially the same as and/or analogous to the display apparatus of FIGS. 1 to 3 except for compensating for load deviation using an output buffer of a gate circuit.

First gate circuits GDa1 and GDa2 including a first output buffer may be electrically connected to a first scan line Sla (which is spaced from the non-display opening peripheral area HPA). Second gate circuits GDb1 and GDb2 including a second output buffer may be electrically connected to a second scan line SLb (which extends through and/or overlaps the non-display opening peripheral area HPA). Third gate circuits GDc1 and Gdc2 including a third output buffer may be electrically connected to a third scan line SLc (which is spaced from the non-display opening peripheral area HPA). In the first to third gate circuits, first to third scan signals may be output through the first to third output buffers, respectively.

The second output buffer of the second gate circuits GDb1 and GDb2 connected to the second scan line SLb may be smaller than the first or third output buffer of the first or third gate circuit of the first or third scan line SLa or SLc. For example, when a width of the first or third output buffer is about 120 micrometers, a width of the second output buffer may be about 104 micrometers.

The size difference may provide an output difference between the gate circuits to compensate for the loading variation. The first to third output buffers may be light emission control buffers that output light emission control signals of the organic light emitting diodes.

For the signal wiring corresponding to the opening area H, the buffer size is reduced to produce an output difference sufficient for compensating for the load difference. Advantageously, display quality deterioration may be minimized or prevented.

Alternative to or in addition to the difference of the output buffer sizes, the second output buffer may include a double gate transistor, and the first output buffer may include a single gate transistor, in order to compensate for load variations/differences.

Figure 18:
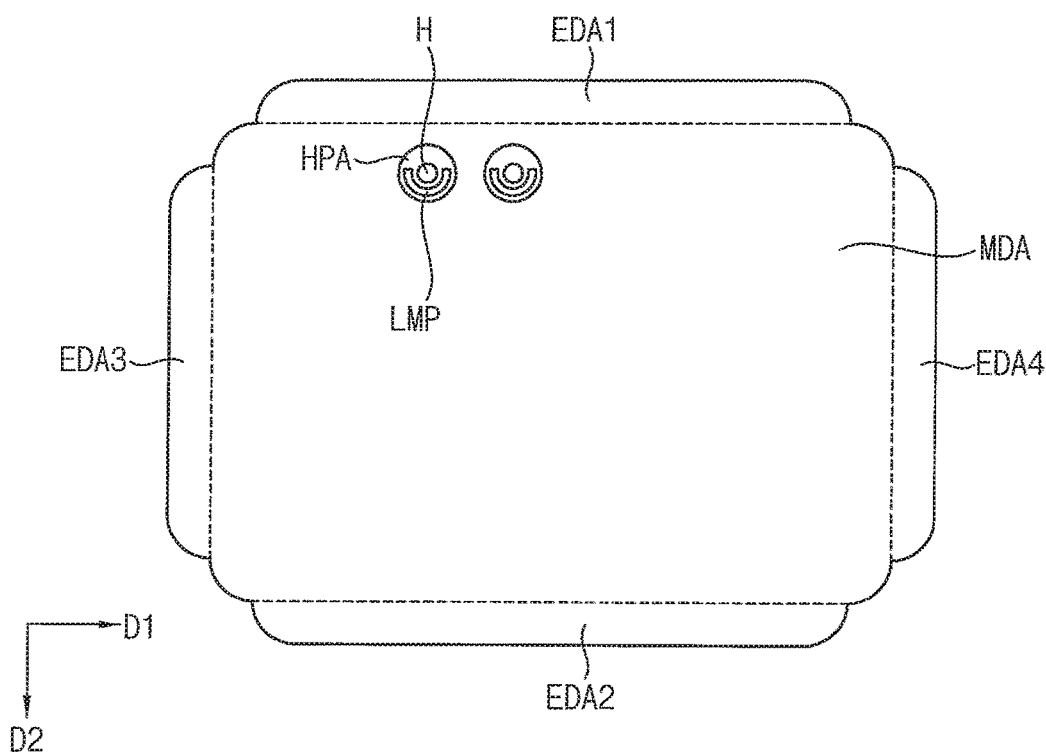
FIG. 18 is a plan view illustrating a display apparatus according to an embodiment.

FIG. 18 is a plan view illustrating a display apparatus according to an embodiment.

Referring to FIG. 18, the display apparatus may be substantially the same as and/or analogous to the display apparatus of FIGS. 1 to 3 except for positions of the opening area(s) H and the opening peripheral area(s) HPA.

An opening area H and an opening peripheral area HPA may be formed adjacent to a long side of a main display area MDA. The main display area MDA has a length in a first direction D1 longer than a length in a second direction D2, and the opening area H and the opening peripheral area HPA are formed adjacent to the long side of the main display area MDA. Multiple opening areas H may be substantially aligned in the first direction D1. Multiple opening peripheral areas HPA may be substantially aligned in the first direction D1.

Figure 19:
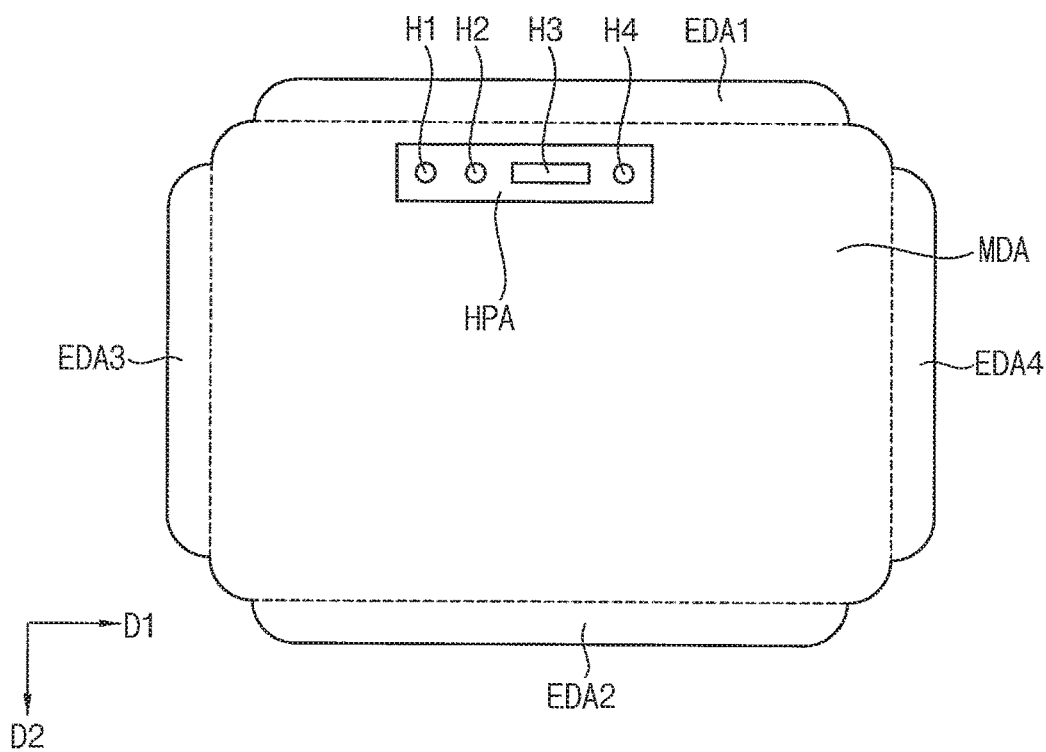
FIG. 19 is a plan view illustrating a display apparatus according to an embodiment.

FIG. 19 is a plan view illustrating a display apparatus according to an embodiment.

Referring to FIG. 19, the display apparatus is substantially the same as and/or analogous to the display apparatus of FIGS. 1 to 3 except for opening areas and an opening peripheral area.

The opening areas may include a first opening area H1, a second opening area H2, a third opening area H4, and a fourth opening area H4 spaced apart from each other. The opening peripheral area HPA may surround the opening areas H1 to H4 and may have a substantially rectangular shape/structure. The opening areas H1 to H4 may have different shapes, such as a rectangle and a circle.

Figure 20:
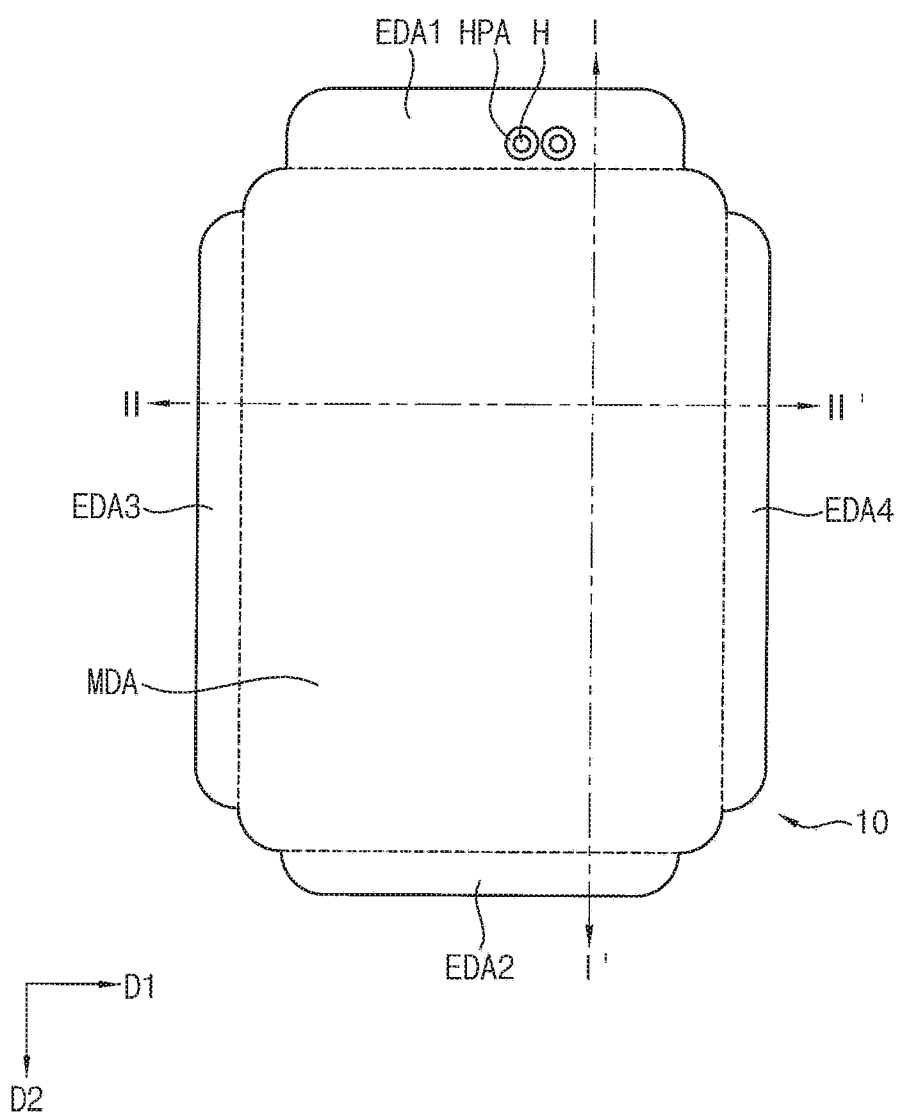
FIG. 20 is a plan view illustrating a display apparatus according to an embodiment.
Figure 21A:
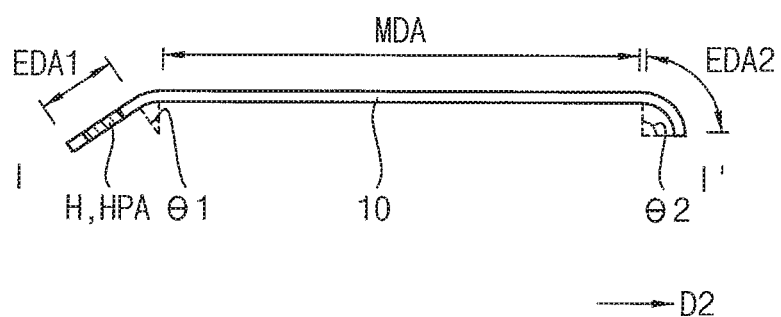
FIG. 21A is a cross-sectional view taken along a line I-I' of FIG. 20 according to an embodiment.
Figure 21B:
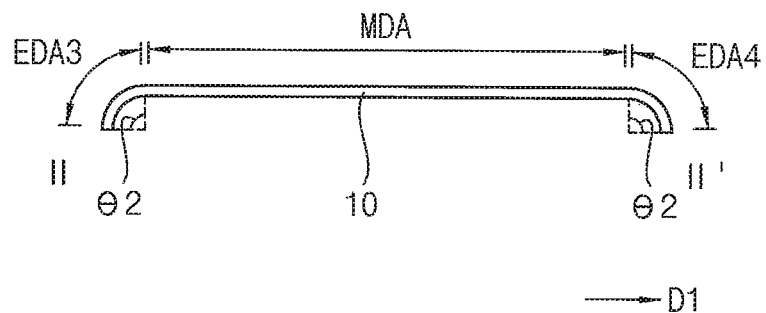
FIG. 21B is a cross-sectional view taken along a line II-IF of FIG. 20 according to an embodiment.

FIG. 20 is a plan view illustrating a display apparatus according to an embodiment. FIG. 21A is a cross-sectional view taken along a line I-I' of FIG. 20 according to an embodiment. FIG. 21B is a cross-sectional view taken along a line II-IF of FIG. 20 according to an embodiment.

Referring to FIGS. 20 to 21B, an opening area H and an opening peripheral area HPA are formed in the first edge display area EDA1. The portion of the substrate at the opening area H and the opening peripheral area HPA may be flat without bending. This is because an optical module may be disposed in the opening area H, and performance of the optical module may be degraded due to reflected light if the substrate is bent at the opening area H or the opening peripheral area HPA.

The bending degree of the first edge display area EDA1 relative to the main display area MDA may be unequal to the bending degree of each of the edge display areas EDA2, EDA3, and EDA4 relative to the main display area MDA. For example, the first non-obtuse angle θ1 between a surface normal to the first edge display area EDA1 and a surface normal to the main display area MDA may be smaller than a second non-obtuse angle θ2 between a surface normal to one of the edge display areas EDA2 to EDA4 and a surface normal to the main display area MDA.

Figure 22:
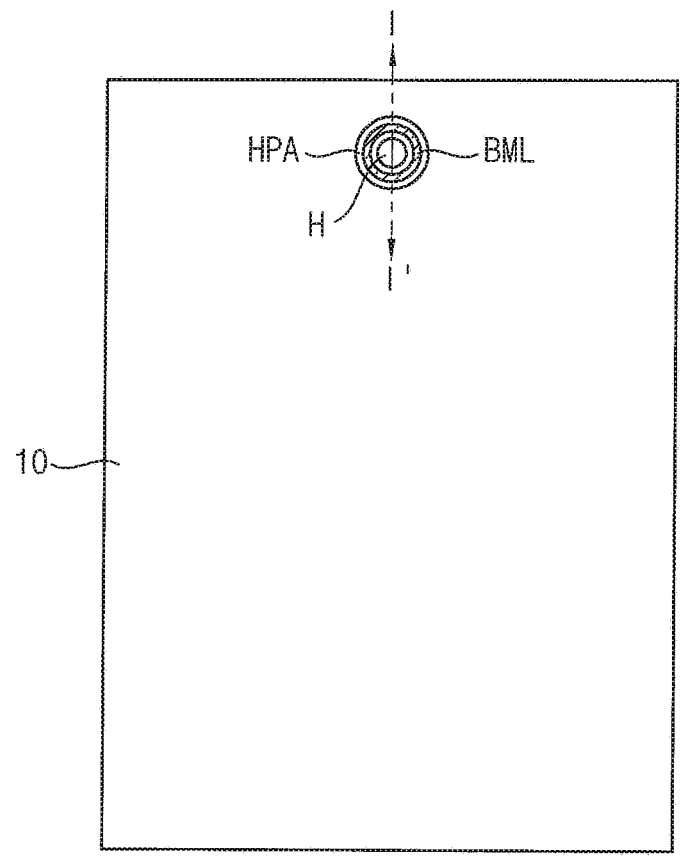
FIG. 22 is a plan view illustrating a display apparatus according to an embodiment.
Figure 23:
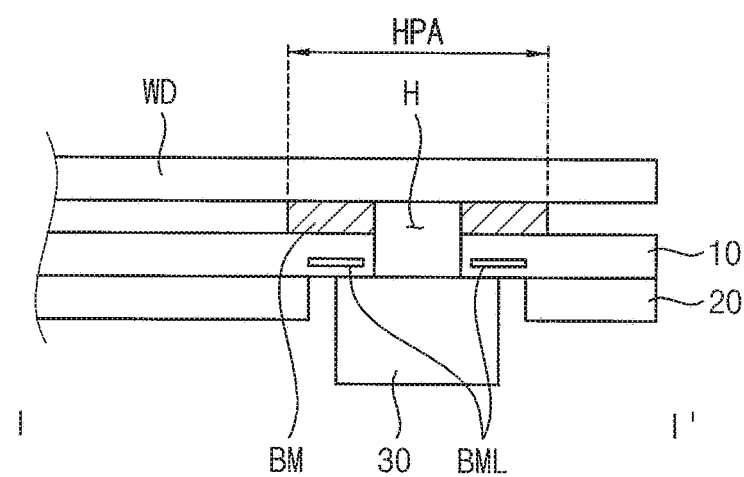
FIG. 23 is a cross-sectional view taken along a line I-I' of FIG. 22 according to an embodiment.

FIG. 22 is a plan view illustrating a display apparatus according to an embodiment. FIG. 23 is a cross-sectional view taken along a line I-I' of FIG. 22 according to an embodiment.

Referring to FIGS. 22 and 23, the display apparatus includes a display panel 10, a cover window WD disposed on the display panel 10, a light shielding member BM disposed between the display panel 10 and the cover window WD and overlapping the non-display opening peripheral area HPA of the substrate of the display panel 10 (i.e., positioned in the opening peripheral area HPA of the display apparatus), and an optical module 30 overlapping the position of the opening area H. The display panel 10 may be substantially the same as and/or analogous to the display apparatus of FIGS. 1 to 3. The display apparatus may further include a protective sheet 20 disposed under the display panel 10.

The lower conductive layer (see description of FIG. 3) of the display panel 10 may further include a lower light shielding pattern BML.

The lower light shielding pattern BML may overlap the opening peripheral area HPA to block light leakage between the optical module 30, the display panel 10, and the light blocking member BM. Since the lower light blocking pattern BML may prevent light leakage, a portion of the protective sheet 20 corresponding to the opening peripheral area HPA is removed. Accordingly, the space between the optical module 30 and the display panel 10 can be minimized, such that the overall thickness of the display apparatus may be minimized, and/or the performance of the optical module 30 may be optimized.

Figure 24:
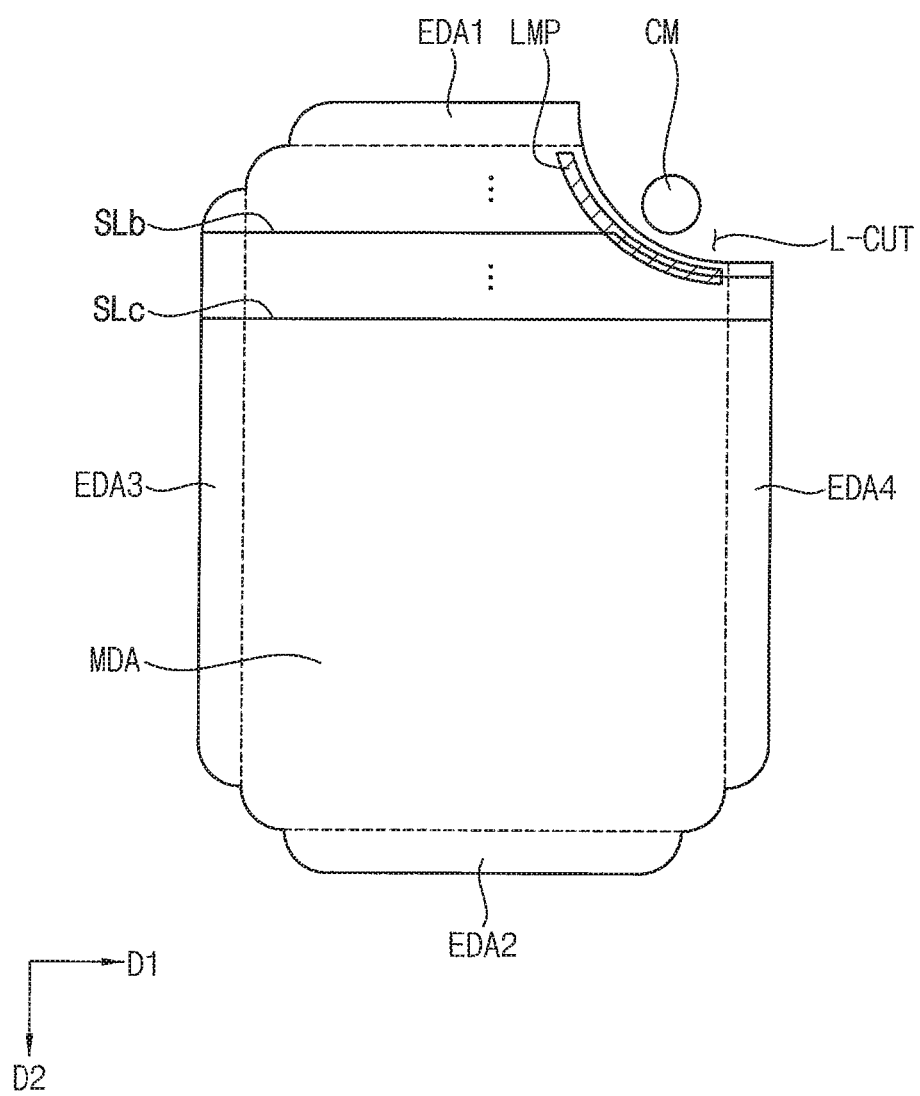
FIG. 24 is a plan view illustrating a display apparatus according to an embodiment.

FIG. 24 is a plan view illustrating a display apparatus according to an embodiment.

Referring to FIG. 24, the display apparatus is substantially the same as and/or analogous to the display apparatus of FIGS. 1 to 3 except that, an opening area (which corresponds to an optical module CM) is formed at an edge/corner of a display area, the opening area has a L-cut or C-cut shape, and a load matching part LMP may partially surround the opening area.

Figure 25:
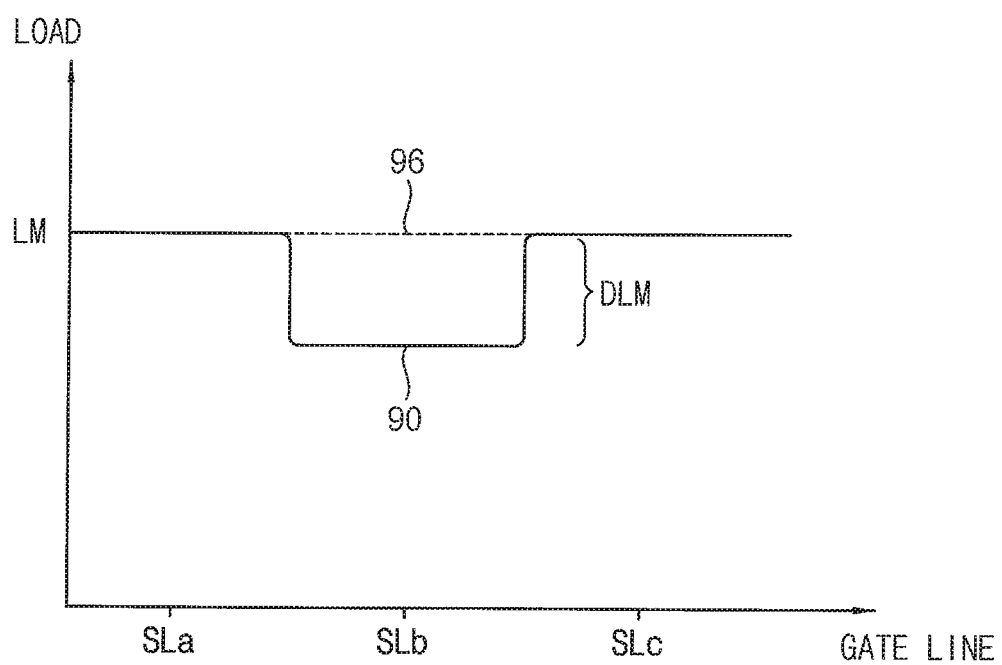
FIG. 25 is a graph showing how gate line loading may be adjusted as a function of row position in a display to help minimize display brightness variations in accordance with an embodiment.

FIG. 25 is a graph showing how gate line loading may be adjusted as a function of row position in a display to help minimize display brightness variations in accordance with an embodiment.

FIG. 25 illustrates an effect of reducing the brightness fluctuations in a display apparatus. The display apparatus has an opening area and an opening peripheral area, such that different pixel rows may have unequal numbers of pixels. The line 90 on the graph corresponds to a display apparatus that includes no supplemental loading structures. There may be a significant discontinuity, or loading difference DLM), between an amount of loading of the pixel row (connected to the scan line SLb in FIG. 1) corresponding to the opening peripheral area and an amount of loading of an adjacent pixel row (connected to the scan line SLa or SLc in FIG. 1) spaced from the opening peripheral area. This discontinuity can result in noticeable variation in the brightness of the pixels.

Such brightness fluctuations may be minimized or prevented by implementing load difference compensation according to embodiments. According to embodiments, as illustrated by the line 96, the amount of loading LM of the pixel row corresponding to the opening peripheral area may be substantially consistent and may be substantially equal to the loading LM of an adjacent pixel row spaced from the opening peripheral area. Advantageously, satisfactory image display quality may be attained.

Figure 26:
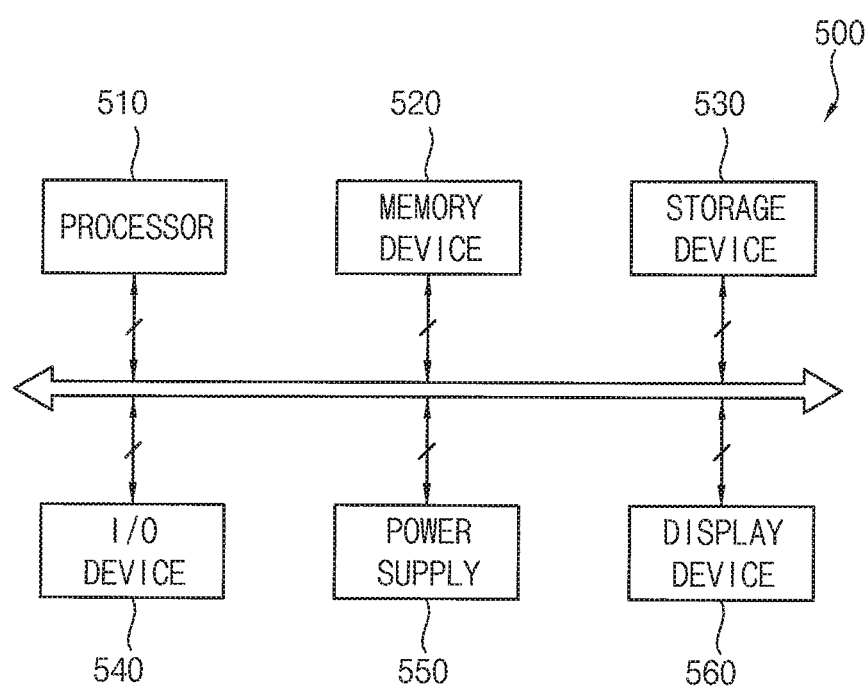
FIG. 26 is a block diagram illustrating an electronic device according to embodiments.
Figure 27A:
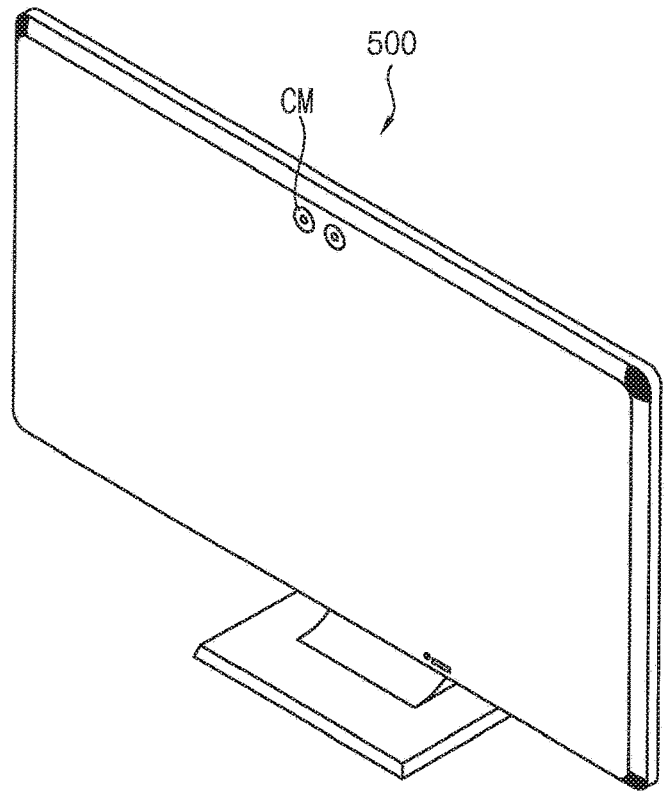
FIG. 27A is a diagram illustrating an example in which the electronic device of FIG. 26 is a television.
Figure 27B:
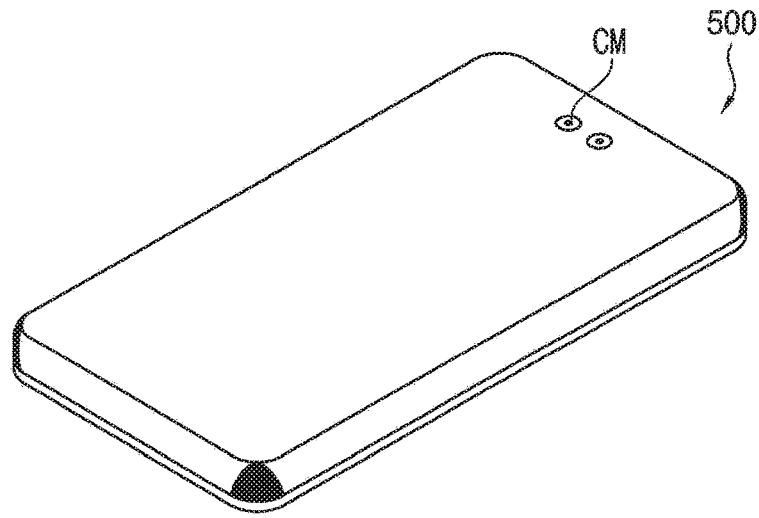
FIG. 27B is a diagram illustrating an example in which the electronic device of FIG. 26 is a smart phone.

FIG. 26 is a block diagram illustrating an electronic device according to example embodiments. FIG. 27A is a diagram illustrating an example in which the electronic device of FIG. 26 is a television. FIG. 27B is a diagram illustrating an example in which the electronic device of FIG. 26 is a smart phone.

Referring to FIGS. 26 through 27B, the electronic device 500 may include a processor 510, a memory device 520, a storage device 530, an input/output (I/O) device 540, a power supply 550, and a display device 560. The display device 560 may correspond to the display apparatus of FIG. 1. The electronic device 500 may further include a plurality of ports for communicating with a video card, a sound card, a memory card, a universal serial bus (USB) device, other electronic devices, etc. In an example embodiment, as illustrated in FIG. 27A, the electronic device 500 may be a television with an optical/functional module CM. In another example embodiment, as illustrated in FIG. 27B, the electronic device 500 may be a smart phone with an optical/functional module CM. The electronic device 500 may be one of a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc. and an output device such as a printer, a speaker, etc. The power supply 550 may provide power for operations of the electronic device 500.

The display device 560 may be coupled to other components via the buses or other communication links. The display device 560 may be included in the I/O device 540. The display device 560 may include an opening area for implementing an optical module and may include an edge display area disposed at an edge of a main display area. A load matching part is disposed in an opening peripheral area that surrounds the opening area. Therefore, satisfactory image display quality can be attained.

Embodiments can be applied to various display devices and can be applied various electronic devices including various display devices. For example, embodiments can be applied to a mobile phone, a smart phone, a video phone, a smart pad, a smart watch, a tablet PC, a car navigation system, a television, a computer monitor, a notebook, and the like.

Although example embodiments have been described, those skilled in the art will readily appreciate that many modifications are possible. All such modifications are intended to be included within the scope defined in the claims. In the claims, means-plus-function clauses are intended to cover the structures described herein as performing the recited function and not only structural equivalents but also equivalent structures.

What is claimed is:

1. A display apparatus, comprising:
a first plurality of pixels;
a substrate including a first opening, a first non-display area, and a main display area, wherein the first non-display area at least partially surrounds the first opening, and wherein the main display area supports the first plurality of pixels;
a first signal line electrically connected to the first plurality of pixels, overlapping the main display area, and overlapping the first non-display area; and
a load matching device overlapping the first non-display area and configured to provide a first electrical load to the first signal line.

2. The display apparatus of claim 1, wherein the substrate includes four edge display areas respectively directly connected to four sides of the main display area and each bent at a predetermined angle with respect to the main display area.

3. The display apparatus of claim 1, wherein the first signal line is a scan line for providing a scan signal to the first plurality of pixels, and wherein the load matching device includes a load matching electrode, and wherein the load matching electrode overlaps the first signal line and provides the first electrical load to the signal line by parasitic capacitance formed by the signal line and the load matching electrode.

4. The display apparatus of claim 3, further comprising:
a shielding electrode;
a first insulating layer disposed directly on each of the load matching electrode and the shielding electrode;
an active member of a thin film transistor disposed on the first insulating layer and overlapping the shielding electrode;
a gate insulating layer disposed on the active member of the thin film transistor; and
a gate electrode of the thin film transistor disposed on the gate insulating layer.

5. The display apparatus of claim 3, further comprising:
an active member of a thin film transistor disposed on the substrate;
a gate insulating layer disposed on the active member of the thin film transistor;
a gate electrode of the thin film transistor disposed on the gate insulating layer;
an interlayer insulating layer disposed on each of the gate electrode and the scan line; and
a source electrode and a drain electrode each disposed directly on the interlayer insulating layer and each electrically connected to the active member of the thin film transistor,
wherein the load matching electrode is disposed directly on the interlayer insulating layer, and
wherein a material of the load matching electrode is identical to a material of each of the source electrode and the drain electrode.

6. The display apparatus of claim 1, wherein the load matching device is a dummy pixel electrically connected to the first signal line.

7. The display apparatus of claim 1, wherein the load matching device comprises a zigzag structure electrically connected to the first signal line.

8. The display apparatus of claim 1, wherein the first signal line has a first width perpendicular to a lengthwise direction of the first signal line, wherein the load matching device is electrically connected to the first signal line and has a second width perpendicular to the lengthwise direction of the first signal line, and wherein the first width is unequal to the second width.

9. The display apparatus of claim 1, further comprising:
a second signal line spaced from each of the first non-display area and the load matching device in a plan view of the display apparatus.

10. The display apparatus of claim 1, further comprising:
a second signal line spaced from the first non-display area in a plan view of the display apparatus;
a first gate circuit including a first output buffer that is electrically connected to the first signal line; and
a second gate circuit including a second output buffer that is electrically connected to the second signal line.

11. The display apparatus of claim 10, wherein the second output buffer is larger than the first output buffer.

12. The display apparatus of claim 10, wherein the second output buffer includes a double gate transistor, and wherein the first output buffer includes a single gate transistor.

13. The display apparatus of claim 10, wherein the first opening includes a first through hole that extends through the substrate.

14. The display apparatus of claim 1, wherein the substrate further includes a second opening spaced apart from the first opening and further includes a second non-display area surrounding the second opening,
- wherein the first signal line overlaps the second non-display area, and
- wherein the display apparatus further comprises a second load matching device overlapping the second non-display area and configured to provide a second electrical load to the first signal line.

15. The display apparatus of claim 1, wherein the substrate further includes a second opening spaced apart from the first opening, and wherein the first non-display area surrounds each of the first opening and the second opening.

16. The display apparatus of claim 1, wherein the first opening is positioned closer to a first side of the main display area than to a second side of the main display area, and wherein the first side of the main display area is opposite the second side of the main display area and is shorter than a third side of the main display area.

17. The display apparatus of claim 1, further comprising a second plurality of pixels, wherein the substrate includes a first edge display area, wherein the first edge display area supports the second plurality of pixels and is bent relative to the main display area, and wherein the first opening is formed in the first edge display area.

18. The display apparatus of claim 1, wherein the first opening is formed at an edge of the main display area, and wherein the first non-display area partially surrounds the first opening.

19. The display apparatus of claim 1, further comprising:
- a first light shielding member overlapping the first non-display area;
- a shielding electrode;
- an insulating layer disposed on each of the first light shielding member and the shielding electrode;
- an active member of a thin film transistor disposed on the lower insulating layer and overlapping the shielding electrode;
- a light emitting structure disposed on the substrate and electrically connected to the thin film transistor;
- a cover window disposed on the substrate;
- a second light shielding member disposed between the substrate and the cover window and overlapping the first non-display area; and
- an optical module overlapping a position of the first opening.

20. A display apparatus, comprising:
- a first plurality of pixels;
- a substrate including a first opening, a first non-display area, a main display area, and four edge display areas, wherein the first non-display area at least partially surrounds the first opening, wherein the main display area surrounds the first non-display and supports the first plurality of pixels, wherein the four edge display areas are respectively directly connected to four sides of the main display area and are each bent at a predetermined angle relative to the main display area; and
- a first signal line electrically connected to the first plurality of pixels and overlapping the first non-display area.

* * * * *